US006436781B2

United States Patent
Sato

(10) Patent No.: US 6,436,781 B2
(45) Date of Patent: Aug. 20, 2002

(54) HIGH SPEED AND LOW PARASITIC CAPACITANCE SEMICONDUCTOR DEVICE AND METHOD FOR FABRICATING THE SAME

(75) Inventor: Fumihiko Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/791,800

(22) Filed: Feb. 26, 2001

Related U.S. Application Data

(62) Division of application No. 09/285,793, filed on Apr. 5, 1999, now abandoned.

(30) Foreign Application Priority Data

Apr. 7, 1998 (JP) ............................................. 10-095075

(51) Int. Cl.⁷ ............................................. H01L 21/331
(52) U.S. Cl. ...................... 438/350; 438/320; 438/366; 257/198; 257/588
(58) Field of Search .................................. 438/221, 320, 438/306, 309, 406, 407, 350–366; 257/63, 197, 198, 263, 303, 370, 514, 558

(56) References Cited

U.S. PATENT DOCUMENTS 5,440,152 A * 8/1995 Yamazaki ................... 257/197
5,504,018 A * 4/1996 Sato ............................ 437/31
5,880,516 A * 3/1999 Yamazaki .................... 257/558

FOREIGN PATENT DOCUMENTS

| EP | 0425242 | 5/1991 | | |
|----|---------|--------|----|----|
| EP | 0762511 | 3/1997 | | |
| JP | 21934 | 1/1990 | | |
| JP | 4355929 | 12/1992 | | |
| JP | 5267317 | 10/1993 | | |
| JP | 5315342 | 11/1993 | | |
| JP | 6216145 | 8/1994 | | |
| JP | 969528 | 3/1997 | | |
| JP | 11204539 | 7/1999 | | |
| JP | 2000114267 | * | 4/2000 | ......... H01L/21/331 |

* cited by examiner

Primary Examiner—Caridad Everhart
Assistant Examiner—Calvin Lee
(74) Attorney, Agent, or Firm—Young & Thompson

(57) ABSTRACT

A semiconductor device including a bipolar transistor formed by epitaxial growth or ion implantation is provided has an epitaxial silicon collector layer, a base region directly under an emitter defined as an intrinsic base and a peripheral region thereof defined as an outer base region is formed by the step of implanting ions into the collector layer to form a high concentration collector region at a location close to a buried region using a photoresist to form an aperture, and the step of implanting ions into the collector layer to form a high concentration collector region directly beneath the base region after forming the base region.

14 Claims, 19 Drawing Sheets

F I G. 17A
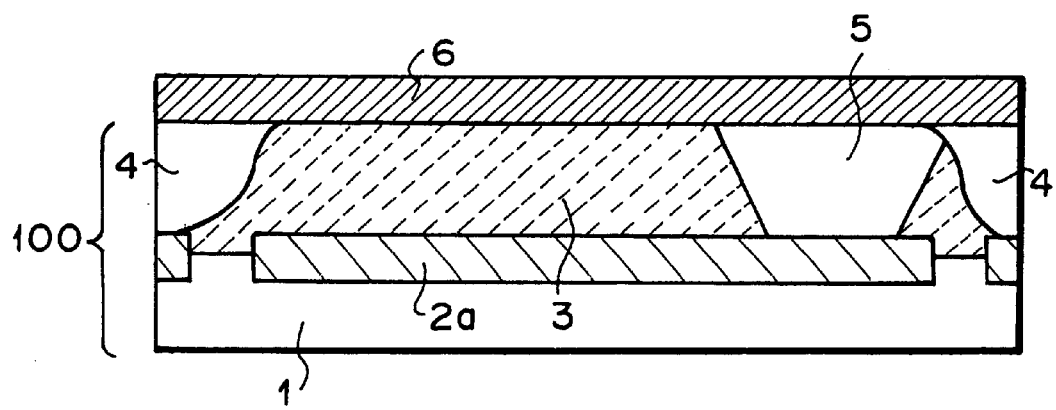
F I G. 17B
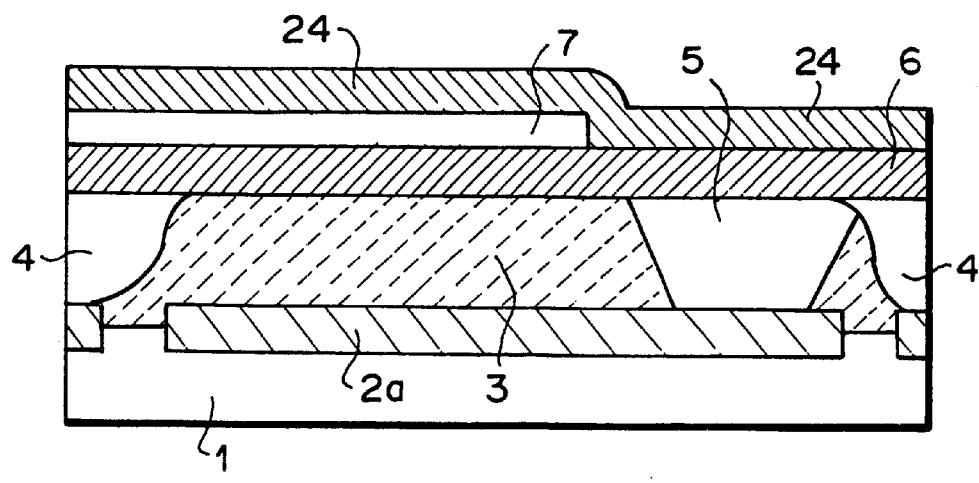

F I G. 20A
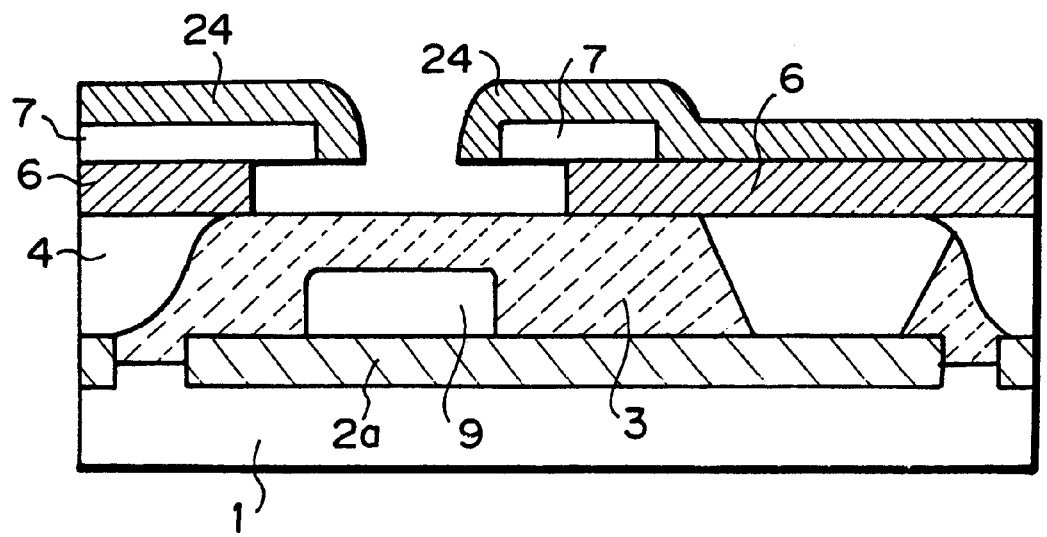
F I G. 20B
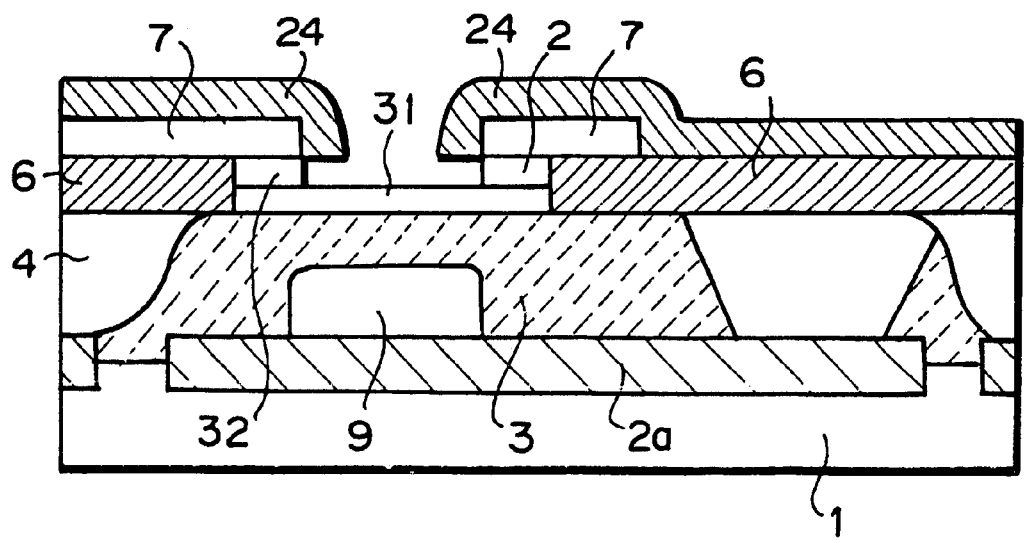

HIGH SPEED AND LOW PARASITIC CAPACITANCE SEMICONDUCTOR DEVICE AND METHOD FOR FABRICATING THE SAME

This is a divisional application of application Ser. No. 09/285,793, filed on Apr. 5, 1999 and abandoned Apr. 30, 2001.

BACKGROUND OF THE INVENTION

1. Field of the Invention

The present invention relates to a semiconductor device, and more particularly to a high speed and low parasitic capacitance semiconductor device including a vertical transistor and a heterojunction bipolar transistor, and a method for fabricating such the device.

2. Description of the Related Art

A high speed bipolar transistor may be realized by increasing cut-off frequency $f_T$ as well as reducing the parasitic capacitance and parasitic resistance. A typical parasitic capacitance includes collector-base capacitance $C_{CB}$. A pn junction capacitance per unit junction area may be determined almost with a relatively lower one between impurity concentrations in p-type and n-type regions. Thus, capacitance $C_{CB}$ can be determined in accordance with a design for the collector concentration. When focusing attention only on the parasitic capacitance, therefore, it is desirable to reduce the collector concentration as low as possible.

On the other hand, however, the collector capable of improving cut-off frequency $f_T$ may have a relatively higher concentration to prevent the electric field from decreasing inside the depletion layer between the collector and base at high current operation. Thus, the contrary requests must be satisfied at the same time.

Any conventional technology has not responded such the requests and still includes the following disadvantages. A base region on which an emitter is formed directly is hereinafter referred to as an intrinsic base and a peripheral region thereof is called an outer base region.

FIG. 24 is a vertical cross sectional view showing a semiconductor device according to a first related art. The device includes p type silicon substrate 1, n$^+$ buried layer 2a, adjacent p$^+$ buried layer 2b, epitaxial silicon collector layer 3, silicon oxide 4 formed by LOCOS (local oxidation of silicon) and collector lead-out region 5. The device also includes silicon oxide 6, polysilicon base electrode 7, silicon oxide 8, outer base region 10, intrinsic base 11, second collector region 12, polysilicon emitter electrode 13 and single crystalline emitter region 14. The device further includes silicon oxide 15, aluminum alloy emitter electrode 16a, aluminum alloy base electrode 16b, aluminum alloy collector electrode 16c, first aperture 101, second aperture 102 and third aperture 103.

A vertical bipolar transistor is fabricated with emitter 14, intrinsic base 11 and second collector 12, in the above semiconductor device, which are lead out through the electrodes isolated by silicon oxides 6, 8 and 15.

Second collector 12 located directly beneath outer base 10 has a high collector concentration equal to that of the region directly beneath intrinsic base 11 in this semiconductor device. Whereas the high speed may be achieved to a certain extent, therefore, the collector-base capacitance intends to increase.

FIG. 25 is a vertical cross sectional view showing another semiconductor device according to the first related art. Description for the same portions as those in FIG. 24 may be omitted in FIG. 25 with giving the same reference numerals. Note that a feature of collector 12 greatly differs from that in FIG. 24.

The collector concentration directly beneath outer base 10 in the semiconductor device is controlled lower than that of the region directly beneath intrinsic base 11. However, low concentration collector region 3 is interposed between high concentration collector region 12 directly beneath intrinsic base 11 and n$^+$ buried layer 2a. Therefore, cut-off frequency $f_T$ may decrease even if the collector-base capacitance is small.

FIG. 26 is a vertical cross sectional view showing a semiconductor device according to a second related art. The device includes p type silicon substrate 1, n$^+$ buried layer 2a, adjacent p$^+$ buried layer 2b, epitaxial silicon collector layer 3, LOCOS silicon oxide 4 and collector lead-out region 5. The device also includes silicon oxide 6, polysilicon base electrode 7, silicon oxide 8, outer base 10, intrinsic base 11, second collector region 12, polysilicon emitter electrode 13 and single crystalline emitter region 14. The device further includes silicon oxide 15, aluminum alloy emitter electrode 16a, aluminum alloy base electrode 16b and aluminum alloy collector electrode 16c.

A vertical bipolar transistor is fabricated with emitter 14, intrinsic base 11 and second collector 12, in the above semiconductor device, which are lead out through the electrodes isolated by silicon oxides 6, 8 and 15.

In this structure, single crystalline base 11 is epitaxially grown whole over Si collector region 12. Whereas there is no region called outer base 10, a portion directly beneath the emitter may be considered as the intrinsic base. Thus, the collector located direct beneath a peripheral base region of the intrinsic base may also have a high concentration.

FIG. 27 is a vertical cross sectional view showing a semiconductor device according to a third related art. The device includes p-silicon substrate 1, n$^+$ buried layer 2a, adjacent p$^+$ buried layer 2b, epitaxial silicon collector layer 3, LOCOS silicon oxide 4 and collector lead-out region 5. The device also includes a silicon oxide 6, polysilicon base electrode 7, silicon oxide 24, intrinsic base 11, single crystalline Si intrinsic base layer 21, polycrystalline Si layer 22, single crystalline emitter region 23 and silicon oxide 25. The device further includes second collector region 12, polysilicon emitter electrode 13, silicon oxide 15, aluminum alloy emitter electrode 16a, aluminum alloy base electrode 16b and aluminum alloy collector electrode 16c. The device also includes aperture 201 for making silicon oxide 6 contact with single crystalline Si intrinsic base layer 21 and polycrystalline Si layer 22, and aperture 202 for making polysilicon emitter electrode 13 and single crystalline emitter region 23 contact with intrinsic base 21 and polycrystalline Si layer 41.

Whereas aperture 202 must be formed by aligning with previously formed aperture 201 in the first and second related arts, the aperture may only be formed once according to the third related art, whereby miniaturization of the transistor may be achieved.

The above-described related arts, however, can not realize both the low collector concentration for reducing the parasitic capacitance and the high collector concentration for improving the cut-off frequency $f_T$ simultaneously.

SUMMARY OF THE INVENTION

An object of the present invention is to provide a semiconductor device capable of satisfying the contrary requests to achieve both the low collector concentration for reducing the parasitic capacitance and the high collector concentration for improving cut-off frequency $f_T$ simultaneously.

The present invention is provided with a method for fabricating a semiconductor device comprising the steps of: forming a silicon material having a high concentration buried layer and a low concentration surface region; forming a single layer or multi-layered film on the surface of the silicon material; opening an aperture in the film by means of photolithography and dry etch; implanting phosphorous ions into the silicon material to form a first collector region adjacent to the buried layer before removing the photoresist; implanting boron ions into the surface of the silicon material to form an intrinsic base; implanting phosphorous ions selectively into the silicon material to form a second collector region between the intrinsic base and the first collector region with using the film used to form the aperture as the mask; and disposing a polysilicon emitter electrode for diffusing the dopant from the polysilicon emitter electrode into the intrinsic base region to form a single crystalline emitter region.

The present invention is also provided with a method for fabricating a semiconductor device including a bipolar transistor having a base formed by epitaxial growth or ion implantation, wherein the bipolar transistor has an epitaxial silicon collector layer, a base region directly under an emitter defined as an intrinsic base and a peripheral region thereof defined as an outer base region, the method comprising the steps of: implanting ions into the collector layer to form a high concentration collector region at a location close to a buried region with using a photoresist used to form an aperture; forming the base region; and implanting ions into the collector layer to form a high concentration collector region directly beneath the base region.

The present invention is further provided with a method for fabricating a semiconductor device comprising the steps of: forming a silicon material having a high concentration buried layer and a low concentration surface region; forming a first insulating film, a polysilicon base electrode and a photoresist on the silicon material; patterning the photoresist; opening an aperture in the polysilicon base electrode and the insulating film by anisotropic dry etching; implanting phosphorous ions to form a first collector region adjacent to the buried layer; growing a boron doped silicon by non-selective epitaxial growth; forming a single crystalline intrinsic base on the silicon material; forming a polycrystalline silicon on a region other than the intrinsic base; covering the surface with a second insulating film; patterning a photoresist and performing anisotropic dry etching to open an aperture on the intrinsic base; and implanting phosphorous ions to form a second collector region on the first collector region.

The present invention is also provided with a method for fabricating a semiconductor device comprising the steps of: forming a silicon material having a high concentration buried layer and a low concentration surface region; forming a first insulating film on the silicon material; depositing a polysilicon base electrode; removing the undesired polysilicon by photolithography and anisotropic dry etching; covering the whole surface with a second insulating film having a different substance from that of the first insulating film; opening an aperture in the second insulating film and the polysilicon base electrode; implanting phosphorous ions to form a first collector region; forming a third insulating film having the same substance as that of the second insulating film; etching back the third insulating film by a thickness deposited just before to expose the first insulating film; etching the first insulating film in the lateral direction to expose the silicon material and a lower surface of the polysilicon base electrode; forming an intrinsic base and a polycrystalline outer base for connecting the intrinsic base with the polysilicon base electrode by selective crystal growth; and implanting phosphorous ions to form a second collector region.

The present invention is provided with a semiconductor device fabricated by any one of the methods described above.

In the semiconductor device according to the present invention, a base region on which an emitter is formed directly is referred to as an intrinsic base and a peripheral region thereof is called an outer base region. An effective thickness of a collector region in the bipolar transistor that is formed by an epitaxial growth, ion implantation and the like is defined as Wc which means a distance between the intrinsic base and buried layer 2a. A thickness of the intrinsic base is defined as WB. A total thickness originated from the junction interface between the outer base and the collector region through various films disposed thereon to a lower surface of the polysilicon emitter is defined as t. The t is expressed in FIG. 1 as a total thickness including the depth of outer base 10, the film thickness of polysilicon base electrode 7 and the film thickness of silicon oxide 8. This is a transistor structure defined by t<WB+Wc.

The device may be produced by implanting ions into the epitaxial collector layer to form a high concentration collector region at a location close to a buried region with using a photoresist used to form an aperture, and then implanting ions into the collector layer to form a high concentration collector region directly beneath the base region after forming the base region. Thus performing twice ion implantations may realize the improvement of cut-off frequency $f_T$ and the reduction of base-collector capacitance $C_{CB}$ at the same time.

With respect to the heterojunction bipolar transistor in which the collector region consists of Si and the intrinsic base consists of an Si—Ge alloy, a boron-containing region may be formed at an interface between SiGe/Si collector in accordance with a pretreatment before SiGe/Si base growth. In this case, an addition of a dopant with an opposite conductivity for compensating the boron-containing region may be performed after forming the base to prevent an energy barrier from generating in the heterointerface.

Other features and advantages of the invention will be apparent from the following description of the preferred embodiments.

BRIEF DESCRIPTION OF THE DRAWINGS

The present invention will be more fully understood from the following detailed description taken in conjunction with the accompanying drawings in which:

FIGS. 17A, 17B, 18A, 18B, 19A, 19B, 20A, 20B, 21A and 21B are vertical cross sectional views showing a method for manufacturing the semiconductor device according to the third embodiment of the present invention;

DETAILED DESCRIPTION OF THE PREFERRED EMBODIMENTS

A semiconductor device and a method for manufacturing the device according to a first embodiment of the present invention will be described below with respect to the npn bipolar transistor, which may also be applied to the pnp bipolar transistor.

Figure 1:
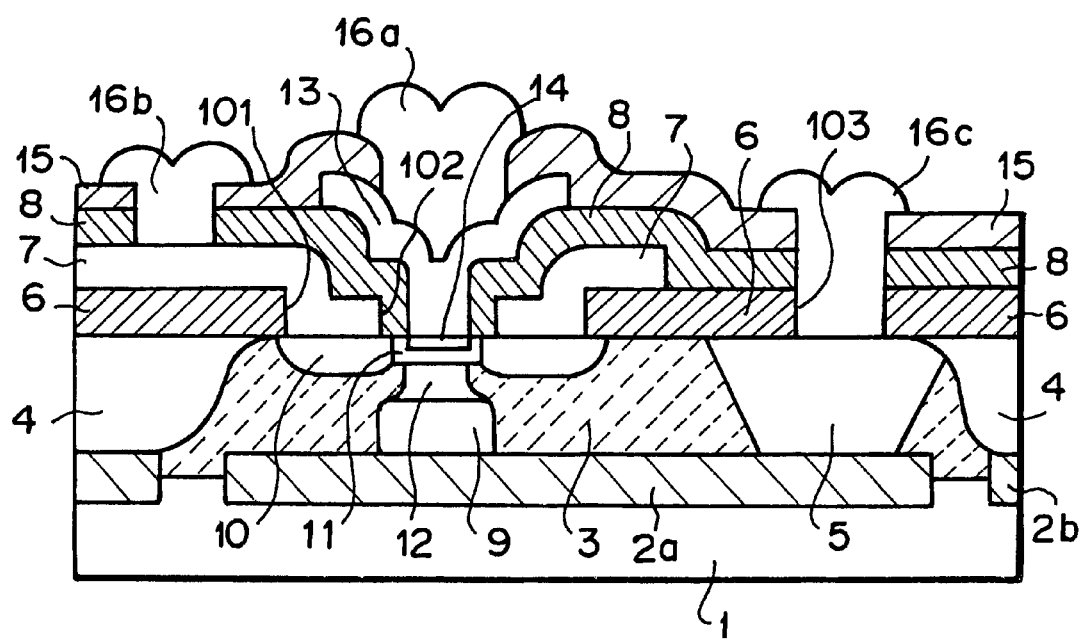
FIG. 1 is a vertical cross sectional view showing a semiconductor device according to a first embodiment of the present invention.

FIG. 1 is a vertical cross sectional view showing the semiconductor device according to the first embodiment of the present invention. P type silicon substrate 1 has a crystal orientation of (100) and a resistivity of 10–20Ω-cm.

Two buried layers 2a and 2b are formed within a surface region having a several m depth inside silicon substrate 1. $N^+$ buried region 2a is separated from $p^+$ buried region 2b for the use of channel stop.

N type epitaxial silicon collector layer 3 is formed over the surface of buried layers 2 and the surface of the silicon substrate in a region where no buried layer is present. Buried layers 2 may be slightly extended into the epitaxial growth layer due to the autodoping and diffusion of the dopant into the growth layer during the epitaxial growth. A region having a dopant concentration lower than $5 \times 10^{16}$ $cm^{-3}$ may be determined as collector epitaxial silicon layer 3. An effective thickness of epitaxial silicon collector layer 3 may be defined as about 0.50 $\mu$m.

LOCOS silicon oxide 4 is formed deeply sufficient to reach at p+ buried layer 2b for isolating epitaxial silicon collector layer 3.

A part of epitaxial silicon collector layer 3 is heavily doped to form $n^+$ collector lead-out region 5 that is connected with $n^+$ buried layer 2a.

Silicone oxide 6 is formed over the surfaces of epitaxial silicon collector layer 3, LOCOS silicon oxide 4 and $n^+$ collector lead-out region 5. First aperture 101 for exposing a part of silicon collector layer 3 to form the base, and third aperture 103 for exposing collector lead-out region 5 are opened in silicon oxide 6.

$P^+$ polysilicon base electrode 7 is formed selectively on silicon oxide 6. Polysilicon 7 contacts with silicon collector layer 3 within first aperture 101 and extends inwardly from an edge of first aperture 101. An edge of the extended portion of polysilicon base electrode 7 is referred to as second aperture 102.

Polysilicon base electrode 7 is covered with silicon oxide 8. Within epitaxial silicon collector layer 3 located directly beneath the base region, a region close to $n^+$ buried layer 2a is defined as n type silicon first collector region 9 that is heavily doped relative to the original impurity concentration of epitaxial silicon collector layer 3.

Outer base 10 is disposed between $p^+$ polysilicon base electrode 7 and epitaxial silicon collector layer 3.

Intrinsic base 11 is disposed at an upper portion of epitaxial silicon collector layer 3 surrounded by outer base 10.

Within epitaxial silicon collector layer 3 located directly beneath the base region, a region between the base and n type silicon first collector region 9 is defined as n type silicon second collector region 12 that is heavily doped relative to the original impurity concentration of collector epitaxial silicon layer 3.

$N^+$ polysilicon emitter electrode 13 is provided at a region directly on intrinsic base 11.

$N^+$ single crystalline emitter region 14 is provided in intrinsic base region 11, which is formed by impurity diffusion from $n^+$ polysilicon emitter electrode 13.

Silicon oxide 15 may cover these regions. Aluminum alloy emitter electrode 16a, aluminum alloy base electrode 16b and aluminum alloy collector electrode 16c contact with polysilicon emitter electrode 13, polysilicon base electrode 7 and collector lead-out region 5, respectively.

A method for manufacturing the semiconductor device according to the first embodiment will be described with reference to the vertical cross sectional views in main process steps.

Figure 2A:
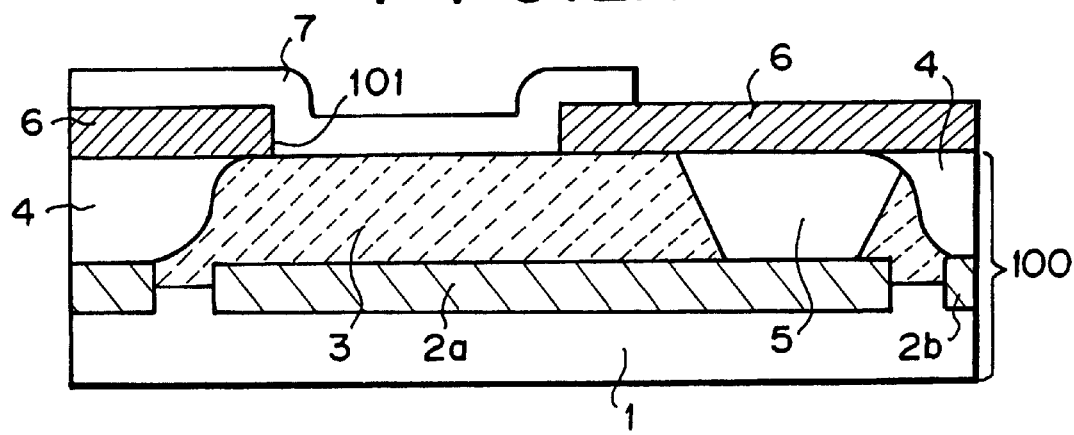
FIGS. 2A, 2B, 3A, 3B, 4A, 4B, 5A, 5B and 6 are vertical cross sectional views showing a method for manufacturing the semiconductor device according to the first embodiment of the present invention.

FIG. 2A is a vertical cross sectional view just after forming polysilicon base electrode 7. P type silicon substrate 1 which has a crystal orientation of (100) and a resistivity of 20 Ω-cm is employed. $N^+$ buried layers 2a and $p^+$ buried region 2b are formed within the surface region of silicon substrate 1.

A silicon oxide (not depicted in the figure) is formed over silicon substrate 1 by a known CDV or thermal oxidation. The silicon oxide has a thickness of several 100 nm (preferably from 300 nm to 700 nm, for example, 500 nm). A photoresist may be patterned on the silicon oxide by a normal lithography. The photoresist may be employed as a mask for removing selectively the silicon oxide at the surface by means of wet etching with a HF-based solution.

After removing the photoresist with an organic-based solution, oxidizing the surface of the silicon substrate within the aperture of the silicon oxide to form an oxide thickness of 20–50 nm subsequently. Then, implanting arsenic ions into the silicon substrate selectively through a thin region of the silicon oxide.

Such a low acceleration energy is required for the ion implantation as to prevent the implanted ions from passing through the silicon oxide mask. The dopan it was suitably implanted with an energy of 70 keV and at a dose of $5 \times 10^{15}$ $cm^{-2}$ to realize a dopant concentration of about $1 \times 10^{19}$ $cm^{-3}$ in the buried layer. Preferable implantation conditions are acceleration energy of 50–120 keV and dose of $5 \times 10^{15}$ to $2 \times 10^{16}$ $cm^{-2}$.

Then, heating at a temperature ranging from 1000° C. to 1150° C. for recovering the damages during the implantation and performing the activation and drive-in diffusion of the implanted arsenic (in this case, heated at 1000° C. for 2 hours in a nitrogen ambient). Thus, $n^+$ buried layer 2a is formed.

Thereafter, removing the 500 nm thick silicon oxide completely with the HF solution, growing a silicon oxide having a thickness of 100 nm (preferably 50–250 nm) by oxidation, pattering the photoresist, implanting boron ions (with 50 keV at $1\times10^{14}$ cm$^{-2}$), removing the resist, and heating for activation (at 1000° C. for 1 hour in a nitrogen ambient) may form p$^+$ buried layer 2b for channel stop.

After removing the silicon oxide completely, growing n$^+$ epitaxial silicon collector layer 3 by a usual process. A growth temperature is preferably 950–1050° C. SiH$_4$ or SiH$_2$Cl$_2$ may be employed as a source gas and PH$_3$ as a dopant gas. The layer 3 may preferably has a thickness of 0.3–1.3 μm and may contain a dopant (phosphorous) of $5\times10^{15}$ to $5\times10^{16}$ cm$^{-3}$. In this case, a region that has a concentration less than $5\times10^{16}$ cm$^{-3}$ is about 0.5 μm thick.

Thus, n$^-$ epitaxial silicon collector layer 3 is grown on buried layers 2.

Then, LOCOS oxide 4 is formed for device isolation by growing a thermal oxide (not depicted in the figure) with a thickness of 20–50 nm over the surface of epitaxial layer 3 and further forming a silicon nitride (not depicted in the figure) with a thickness of 70–150 nm. Thereafter, patterning the photoresist (not depicted in the figure) by photolithography and removing the silicon oxide and nitride by dry etching subsequently.

Further, etching epitaxial silicon layer 3 to form a groove. A depth of the groove (=the depth of silicon to be etched) may suitably be about a half the thickness of the LOCOS oxide. After removing the photoresist, a silicon oxide for isolation or LOCOS oxide 4 is formed in the device region by oxidization with protecting the region by the silicon nitride. LOCOS oxide 4 has a thickness of 300–1000 nm enough to reach at channel stop buried layer 2b. In this case, approximately 600 nm thickness was employed. The silicon nitride is removed with a heated phosphoric acid.

N$^+$ collector lead-out region 5 is formed to reduce the collector resistance by doping phosphorous into the region by means of diffusion or ion implantation.

Namely, forming a photoresist having an opening only at collector lead-out region 5 by photolithography, and then implanting phosphorous ions with acceleration energy of 100 KeV and at dose of $5\times10^{15}$ cm$^{-2}$. After removing the photoresist, performing a heat treatment for activating the doped phosphorous and recovering the damage due to the ion implantation at 1000° C. for 60 minutes in the nitrogen ambient.

Thus, silicon material 100 may be prepared. The surface of silicon material 100 is covered with silicon oxide 6 having a suitable thickness of 100–300 nm. In this case, 200 nm thickness is selected. First aperture 101 may be formed in silicon oxide 6 by known photolithography and etching to expose the surface of epitaxial silicon collector layer 3.

Next, depositing polysilicon 7 with a thickness of 150–350 nm. In this case, 250 nm thickness is selected. Then, implanting boron ions into polysilicon 7 with such a low implantation energy as not to pass through polysilicon 7 at a dose capable of achieving a high dopant concentration of $1\times10^{20}$ cm$^{-3}$. In this case, 10 KeV and $1\times10^{16}$ cm$^{-2}$ are employed.

After patterning photoresist 41, removing undesired polysilicon by dry etching to form p$^+$ polysilicon base electrode 7.

Figure 2B:
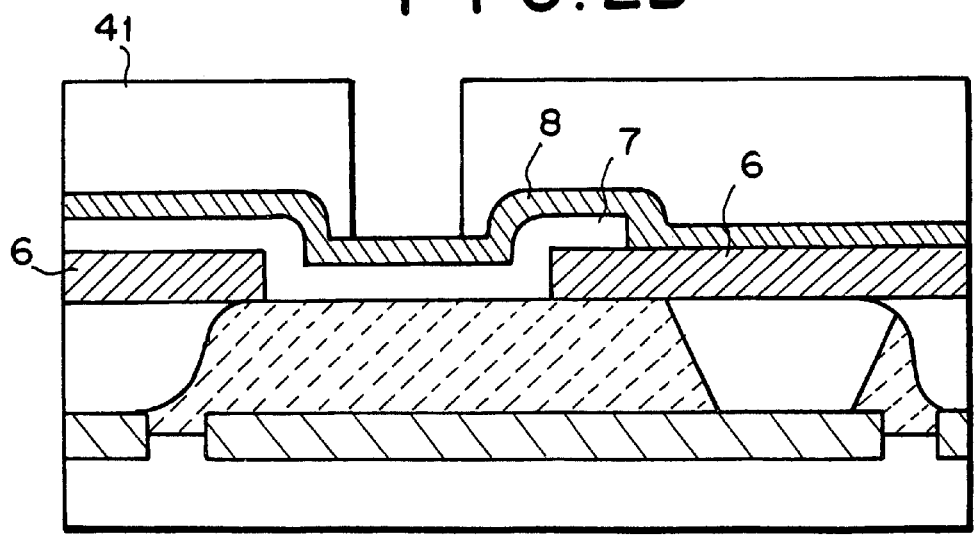

FIG. 2B is a vertical cross sectional view at the stage just after patterning photolithography 41 to form an aperture following the formation of silicon oxide 8 over polysilicon base electrode 7.

Depositing silicon oxide 8 subsequently on the device shown in the preceding figure by LPCVD with a thickness of about 300 nm (the thickness of the silicon oxide is preferably 100–500 nm).

Figure 3A:
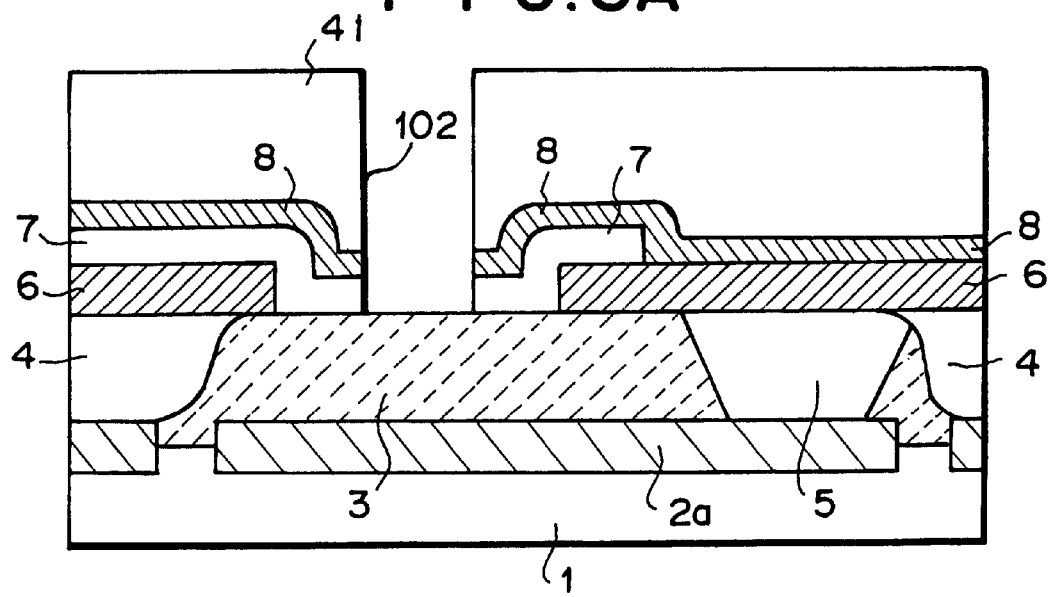

Next, opening an aperture in photoresist 41 at a location where intrinsic base 10 will be formed later by the known photolithography 41. Then, removing silicon oxide 8 and polysilicon base electrode 7 successively by anisotropy dry etching (FIG. 3A). Thus, second aperture 102 is formed.

Figure 3B:
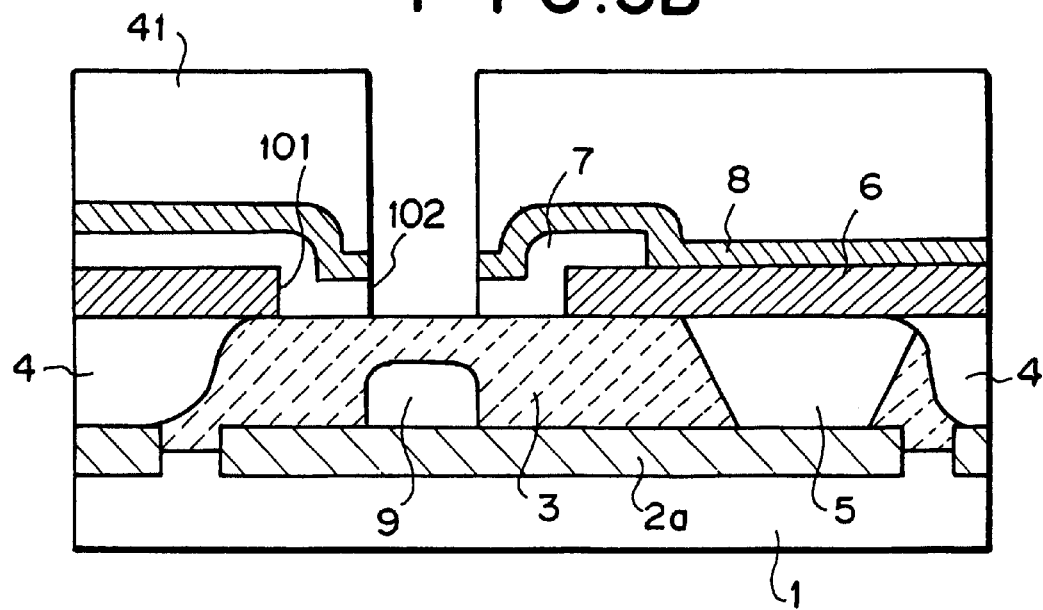

At this stage, one of important process steps according to the present invention, that is, ion implantation of phosphorous is performed to form first collector region 9. The implantation was performed twice under conditions of 300 KeV, $1\times10^{13}$ cm$^{-2}$ and 400 KeV, $2.5\times10^{13}$ cm$^{-2}$ (FIG. 3B).

Figure 4A:
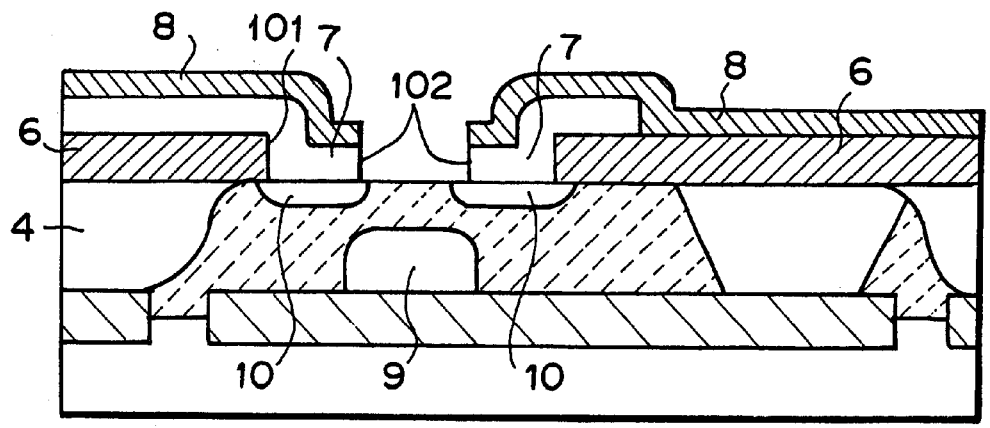

After removing photoresist 41, performing a heat treatment at 900° C. for 60 minutes in the nitrogen ambient for recovering the damages during the implantation and performing the activation of phosphorous. Boron may be diffused during the heat treatment from polysilicon base electrode 7 into epitaxial silicon collector layer 3 to form outer base 10 (FIG. 4A).

Next, implanting boron ions into epitaxial silicon layer 3 through second aperture 102 to form intrinsic base 11. An ion implantation condition is exemplified with acceleration energy of 10 KeV and dose of $5\times10^{13}$ cm$^{-2}$.

Figure 4B:
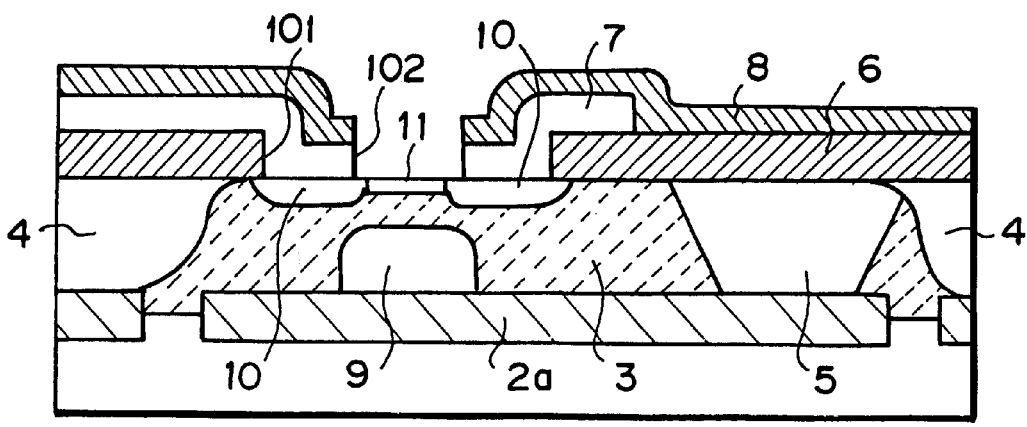

Further, depositing silicon oxide 8 with a thickness of 50–300 nm by LPCVD (FIG. 4B). In this case, it was 200 nm.

Figure 5A:
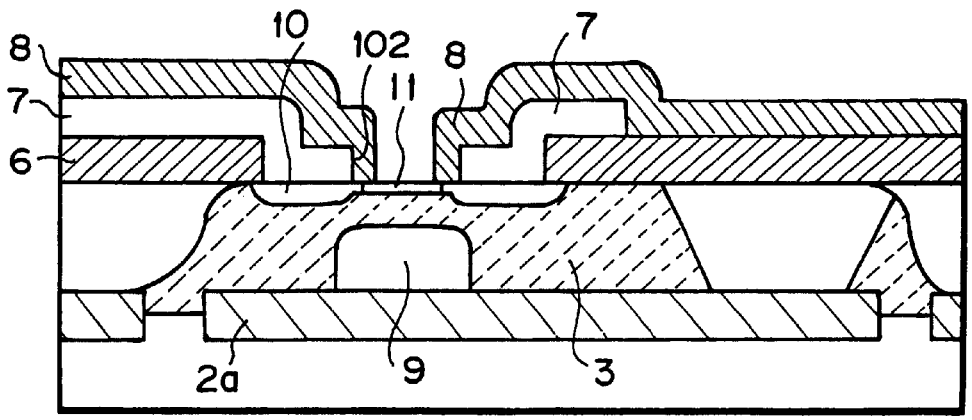

The process that has been performed preceding the stage shown in FIG. 5A will be described next. Removing silicon oxide 8 disposed at the bottom of aperture 102 completely by means of the combination of anisotropy etching and HF-based etching to expose a part of epitaxial silicon collector layer 3. As the result, a side portion of polysilicon base electrode 7 within the aperture may be covered with silicon oxide 8. In the figure, silicon oxide 8 is depicted in combination of silicon oxide 8 that is previously deposited on polysilicon base electrode 7 and silicon oxide 8 that is formed on the inner wall of the aperture.

Outer base 10 that is formed with boron diffusion from polysilicon base electrode 7 may extend toward inside second aperture 102. Therefore, it is required that silicon oxide 8 formed on the side wall of polysilicon base electrode 7 has a thickness larger than the extension of outer base 10. In this case, it was about 300 nm.

Figure 5B:
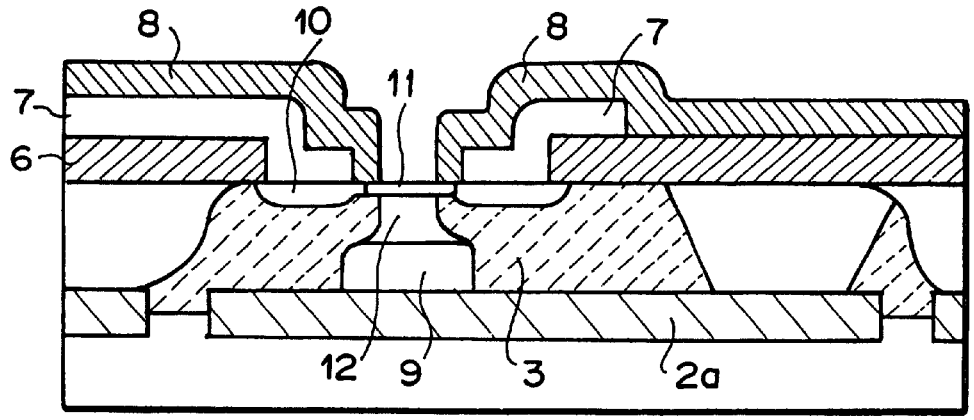

The process that has been performed preceding the stage shown in FIG. 5B will be described next. Performing ion implantation of phosphorous selectively with using silicon oxide 8 and polysilicon base electrode 7 as masks to form second collector region 12. An ion implantation condition is exemplified with 200 KeV and $4\times10^{12}$ cm$^{-2}$.

Figure 6:
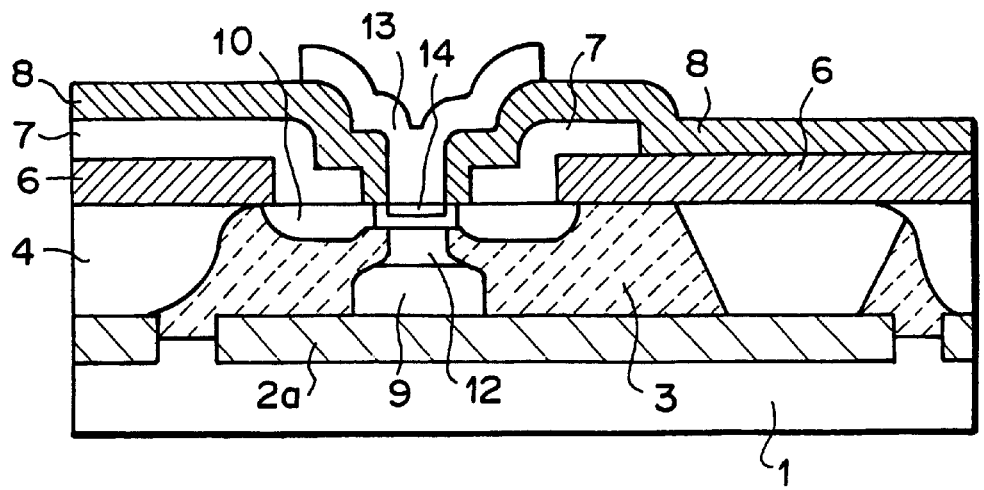

The process that has been performed preceding the stage shown in FIG. 6 will also be described. Depositing non-doped polysilicon about 300 nm by LPCVD and implanting arsenic ions subsequently (acceleration energy: 70 KeV, dose: $1\times10^{16}$ cm$^{-2}$). Further, patterning the polysilicon by photolithography and anisotropy dry etching. Thus, n$^+$ polysilicon emitter electrode 13 is formed. Then, performing heat treatment (at 1000° C. for 10 seconds, for example) for diffusing arsenic from polysilicon emitter electrode 13 into intrinsic base 11 to form n$^+$ single crystalline emitter region 14.

Thereafter, it is covered whole the wafer with about 300 nm thick silicon oxide 15 subsequently. Then, forming an aperture that may reach at polysilicon emitter electrode 13, polysilicon base electrode 7 and collector lead-out region 5 by photolithography and anisotropy etching. After removing the photoresist, spattering aluminum alloy and patterning by photoresist and dry etching may complete the semiconductor device shown in FIG. 1.

A relationship between the acceleration energy for implanting phosphorous ions and the thickness of the photoresist used as the mask will be described below.

1.0 μm thick photoresist may intercept 99.99% phosphorous ions that are implanted with an acceleration energy of about 300 KeV.

Implanting phosphorous ions into silicon with 300 KeV may cause the highest concentration in the phosphorous distribution at a depth of about 0.4 μm below the surface.

If the thickness of the collector region is insufficient, the capacitance may not be reduced even when the concentration of the collector region is sufficiently low. This is because the depletion layer between the base-collector may reach at $n^+$ buried layer 3 to prevent the depletion layer from extending additionally. Therefore, the thickness of epitaxial silicon collector layer 3 is required to be thicker to a certain extent.

Variations of depletion layer W due to applied bias $V_{CB}$ and phosphorous concentration Nc in the collector will be described.

If Nc=1×10$^{16}$ cm$^{-3}$, then W=0.30 μm (when $V_{CB}$=0 V), W=0.43 μm (when $V_{CB}$=1 V) and W=0.61 μm (when $V_{CB}$=3 V).

If Nc=5×10$^{16}$ cm$^{-3}$, then W=0.14 μm (when $V_{CB}$=0 V), W=0.20 μm (when $V_{CB}$=1 V) and W=0.29 μm (when $V_{CB}$=3 V).

If Nc=1×10$^{17}$ cm$^{-3}$, then W=0.10 μm (when $V_{CB}$=0 V), W=0.14 μm (when $V_{CB}$=1 V) and W=0.20 μm (when $V_{CB}$=3 V).

If Nc=2×10$^{17}$ cm$^{-3}$, then W=0.07 μm (when $V_{CB}$=0 V), W=0.10 μm (when $V_{CB}$=1 V) and W=0.14 μm (when $V_{CB}$=3 V).

Phosphorous ions may be implanted into the region directly beneath the intrinsic base down to 0.61 μm if not into the region directly beneath the outer base even in the case where the depletion layer may extend the most in the above combination.

In the case where phosphorous ions are implanted at 400 KeV as described in the present embodiment, the peak of the ion concentration may appear at a depth of 0.53 μm below the surface and thus the ions may reach at a position sufficiently close to the buried layer.

About 2500 nm thick polysilicon, about 300 nm thick silicon oxide and about 1 μm thick photoresist are disposed on the outer base region during the ion implantation.

Therefore, phosphorous implanted at 400 KeV may be intercepted completely with only the photoresist and silicon oxide.

A second embodiment of the present invention will be described with reference to the figures. The present embodiment differs in the intrinsic base formed by the non-selective epitaxial growth from the first embodiment.

Figure 9:
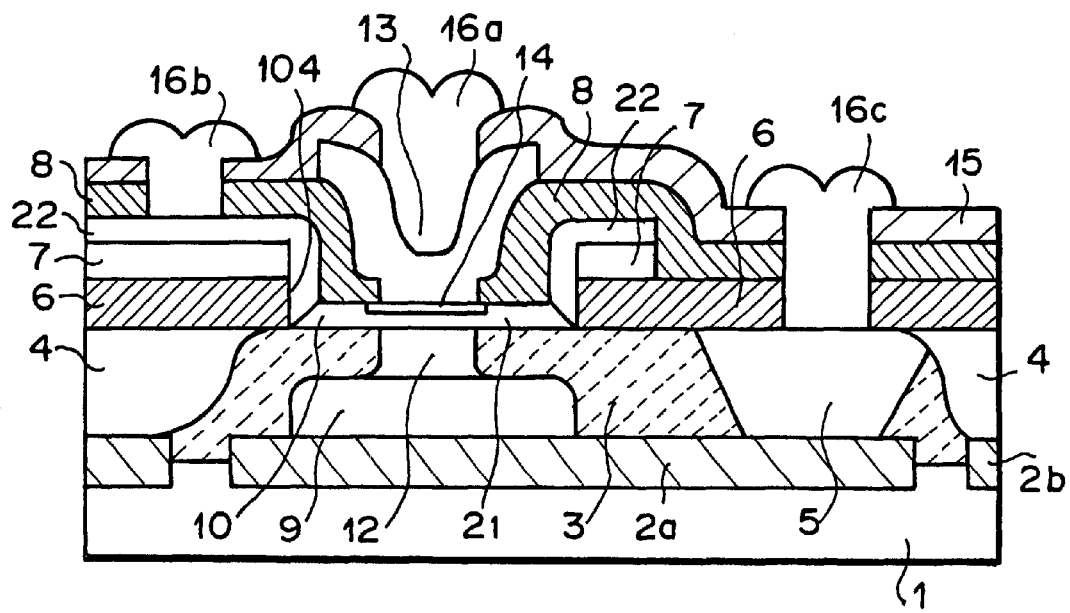
FIG. 9 is a vertical cross sectional view showing a semiconductor device according to a second embodiment of the present invention.

FIG. 9 is a vertical cross sectional view showing a semiconductor device according to the second embodiment. FIG. 9 differs from FIG. 1 in that polysilicon base electrode 7 is present only on silicon oxide 6 and that epitaxial single crystalline Si intrinsic base layer 21 is disposed on epitaxial silicon collector layer 3 within aperture 104. Polycrystalline Si layer 22 may also be formed simultaneously when the base is epitaxially grown.

The device shown in FIG. 9 includes p type silicon substrate 1, $n^+$ buried layer 2a, adjacent $p^+$ buried layer 2b, epitaxial silicon collector layer 3, LOCOS silicon oxide and collector lead-out region 5. The device also includes silicon oxide 6, polysilicon base electrode 7, silicon oxide 8, first collector region 9, outer base region 10, second collector region 12, polysilicon emitter electrode 13 and single crystalline emitter region 14. The device further includes silicon oxide 15, aluminum alloy emitter electrode 16a, aluminum alloy base electrode 16b and aluminum alloy collector electrode 16c.

A method for manufacturing the device according to the present embodiment will be described next.

Figure 10:
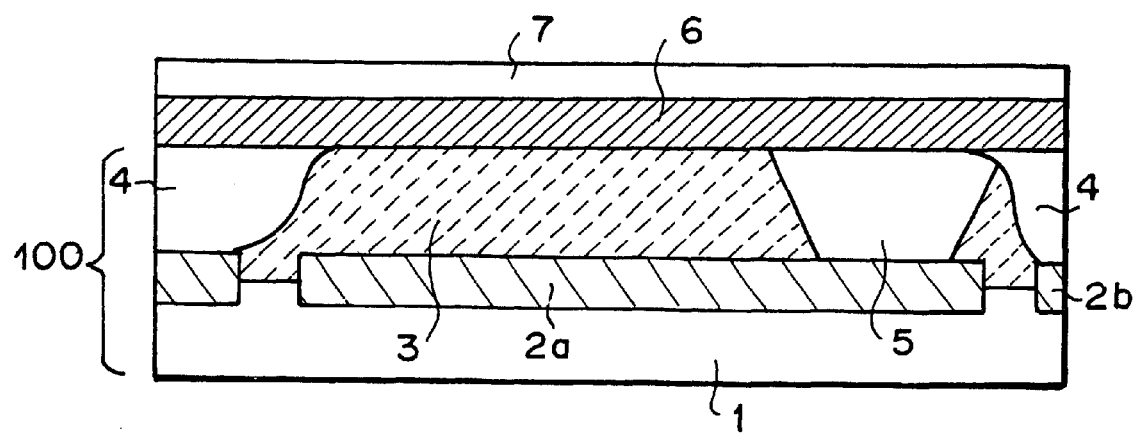
FIGS. 10, 11, 12, 13A, 13B, 14 and 15 are vertical cross sectional views showing a method for manufacturing the semiconductor device according to the second embodiment of the present invention.

FIG. 10 shows the stage where silicon oxide 6 and polysilicon base electrode 7 are formed on silicon material 100 that is formed as the same manner as is in the first embodiment.

Figure 11:
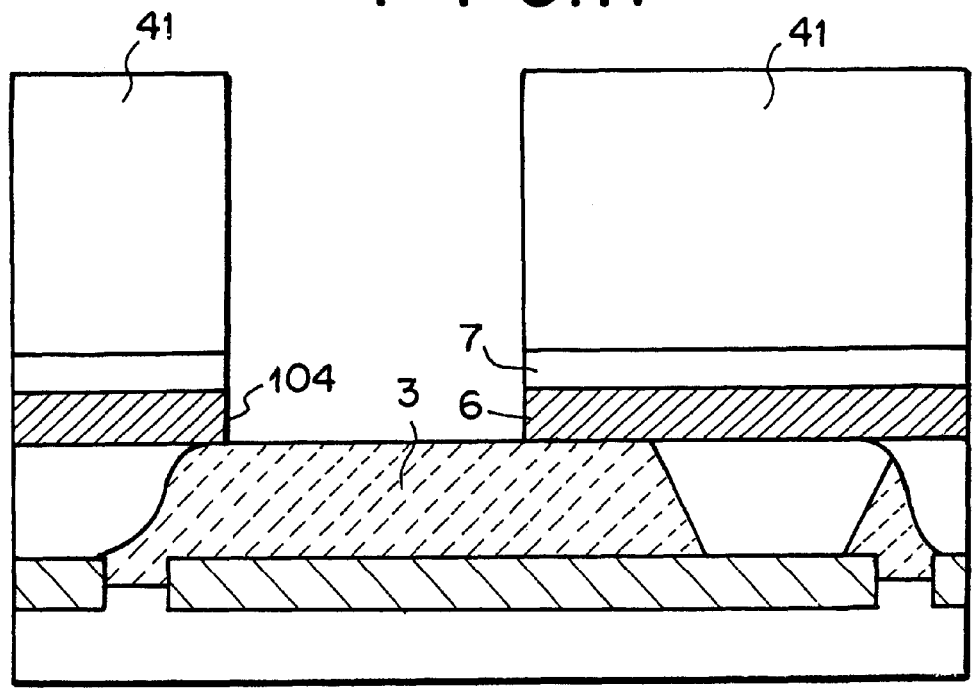

FIG. 11 shows the stage where aperture 104 is opened in silicon oxide 6 and polysilicon base electrode 7 by patterning of photoresist 41 and anisotropic etching.

Figure 12:
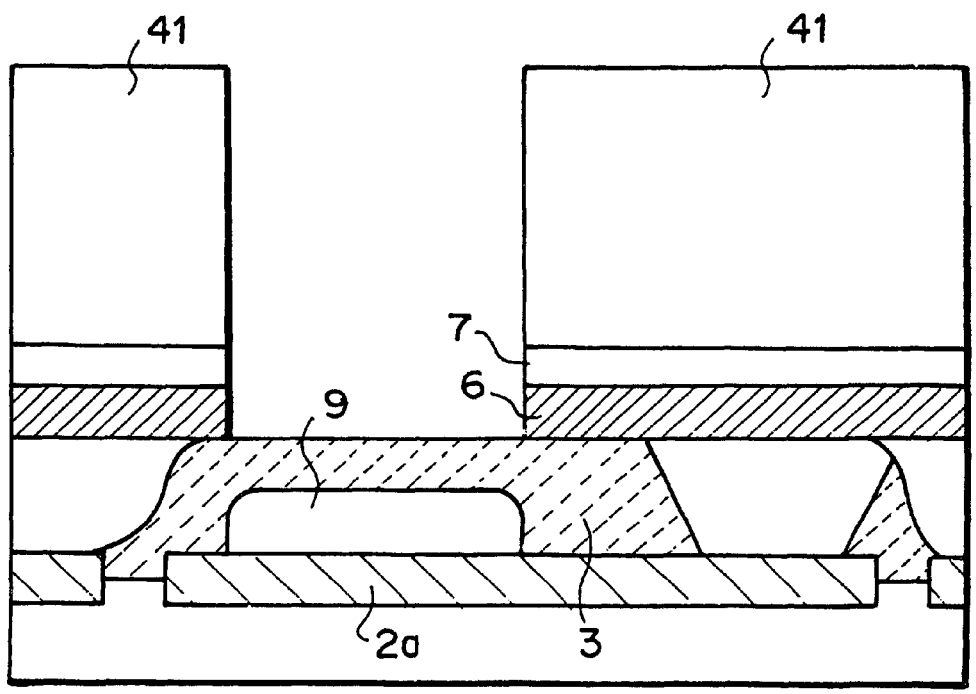

FIG. 12 shows the stage where first collector region 9 is formed by implanting phosphorous ions consequently.

Figure 13A:
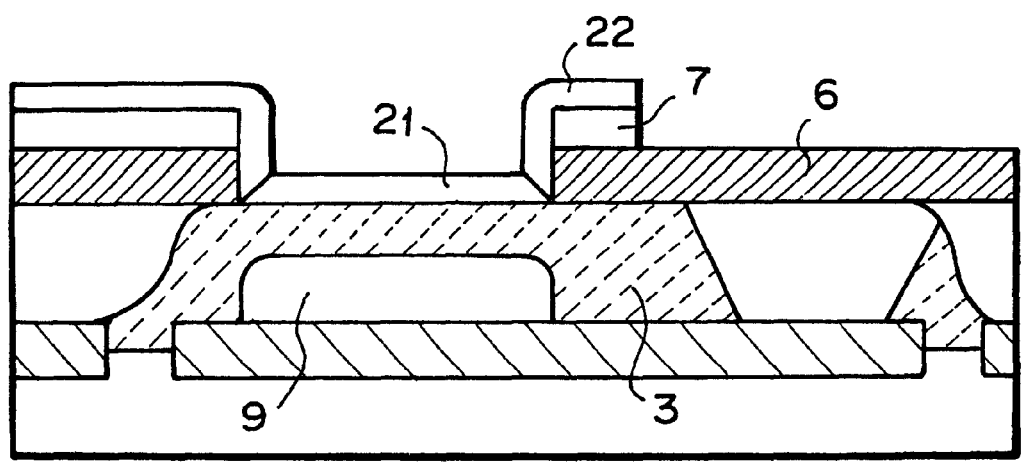

Then, growing boron-doped polysilicon by non-epitaxial growth as shown in FIG. 13A. SiGe may also be grown here, as is described later in the third embodiment. Single crystalline Si intrinsic base layer 21 is formed on epitaxial silicon collector layer 3 and polycrystalline silicon 22 on other region. Then, removing undesired portions of polysilicon base electrode 7 and polycrystalline silicon 22.

Figure 13B:
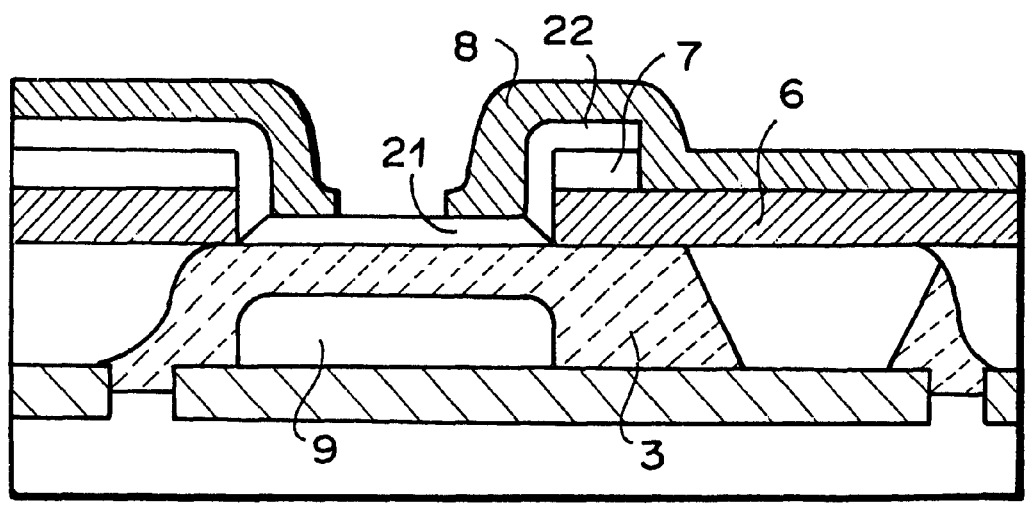

After covering the surface of silicon oxide 8, patterning the photoresist and opening an aperture in the oxide on intrinsic base 21 by anisotropic dry etching as shown in FIG. 13B.

Figure 14:
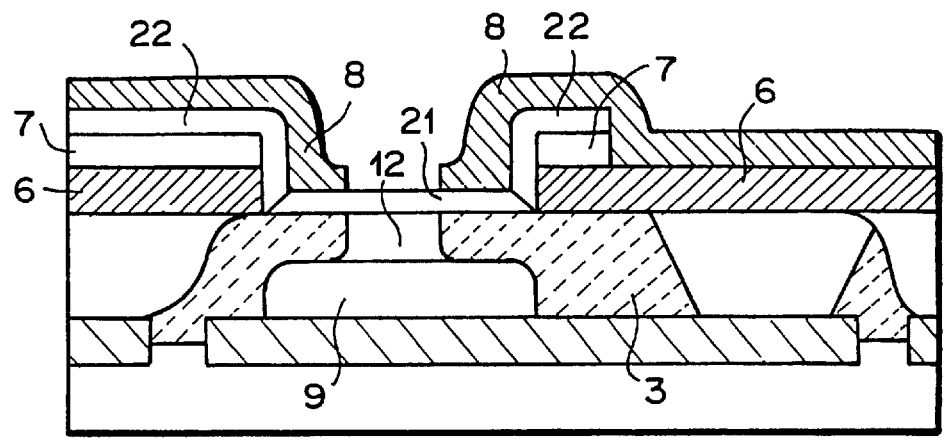

Then, performing phosphorous ion implantation to form second collector region 12 on first collector region 9 as shown in FIG. 14.

Figure 15:
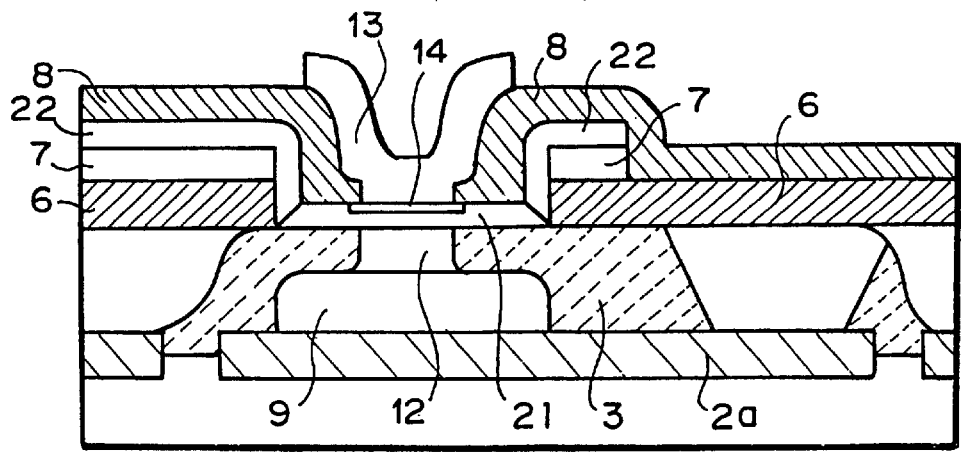

After forming polysilicon emitter electrode 13, forming single crystalline emitter region 14 by heat treatment for drive-in diffusion as shown in FIG. 15.

Thereafter, it is covered the whole wafer with about 300 nm thick silicon oxide 15 subsequently as shown in FIG. 9.

In addition, forming an aperture that may reach at polysilicon emitter electrode 13, polysilicon base electrode 7 and collector lead-out region 5 by photolithography and anisotropy etching. After removing the photoresist, spattering aluminum alloy and patterning by photoresist and dry etch may complete the semiconductor device shown in FIG. 9.

The present embodiment may simplify the process because intrinsic base 21 is formed by the non-selective epitaxial growth. The device according to this embodiment may have a high-speed performance equal to that of the first embodiment.

The present embodiment may also realize an extremely shallow base junction because the base region is formed by the epitaxial growth. Extremely high cut-off frequency $f_T$ may also be realized because of a short distance between the emitter, to where electrons are injected, and the collector at where the electrons may reach.

The present embodiment employs the epitaxial growth that enables to grow materials other than Si, for example, a SiGe alloy, and to also fabricate the heterojunction bipolar transistor.

A third embodiment of the present invention will be described with reference to the figures. The present embodiment is characterized in that the base consists of the SiGe alloy.

Figure 16:
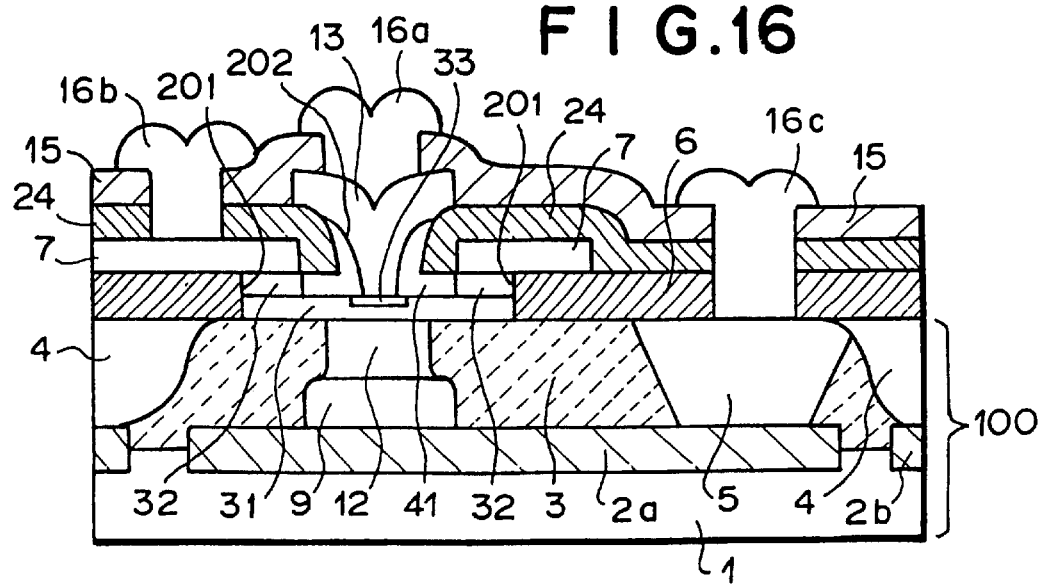
FIG. 16 is a vertical cross sectional view showing a semiconductor device according to a third embodiment of the present invention.

FIG. 16 is a vertical cross sectional view showing a semiconductor device according to the third embodiment. P type silicon substrate 1 has a crystal orientation of (100) and a resistivity of 10–20 Ω-cm. Two buried layers 2a and 2b are formed within a surface region having a several μm depth inside silicon substrate 100. N+ buried region 2a is separated from p+ buried region 2b for the use of channel stop. N type epitaxial silicon collector layer 3 is formed over the surface of buried layers 2 and the surface of silicon substrate 100 in a region where no buried layer is present. Buried layers 2 may be slightly extended into the epitaxial growth layer due to the autodoping and diffusion of the dopant into the growth layer during the epitaxial growth. A region having a dopant concentration lower than $5 \times 10^{16}$ cm$^{-3}$ may be defined as epitaxial silicon collector layer 3. An effective thickness of epitaxial silicon collector layer 3 may be defined about 0.50 μm as same as in the first embodiment. LOCOS silicon oxide 4 is formed deeply sufficient to reach at p+ buried layer 2b for isolating epitaxial silicon collector layer 3.

A part of n− epitaxial silicon layer 3 is heavily doped to form n+ collector lead-out region 5 that is connected with n+ buried layer 2a. Silicone oxide 6 is formed over the surfaces of epitaxial silicon collector layer 3, LOCOS silicon oxide 4 and n+ collector lead-out region 5.

First aperture 201 is formed in silicon oxide 6 for exposing a part of silicon collector layer 3 in order to form the base. p+ polysilicon base electrode 7 is formed selectively on silicon oxide 6. Polysilicon 7 contacts with silicon collector layer 3 within first aperture 201 and extends inwardly from an edge of first aperture 201. Upper and side surfaces of polysilicon base electrode 7 are covered with silicon nitride 24, and a lower surface of a portion of polysilicon base electrode 7, that extends inwardly within aperture 201, contacts with p type polycrystalline layer 32. P type single crystalline intrinsic base layer 31 is epitaxially grown on epitaxial silicon collector layer 3 within aperture 201.

Within epitaxial silicon collector layer 3 located directly beneath the base regions 31 and 32, a region close to n+ buried layer 2 is defined as n type silicon collector 9 that is heavily doped relative to the original impurity concentration of epitaxial silicon collector layer 3.

Within epitaxial silicon collector layer 3 located directly beneath the base regions 31 and 32, a region between the base and first silicon collector region 9 is defined as n type silicon second collector region 12 that is heavily doped relative to the original impurity concentration of epitaxial silicon collector layer 3.

Silicon oxide 41 is formed on silicon nitride 24 that covers polysilicon base electrode 7. An inner space within side walls of silicon oxide 41 is called aperture 202. N+ polysilicon emitter electrode 13 is disposed directly intrinsic base region 31 within aperture 202.

N+ single crystalline silicon emitter region 33 is formed on base region 31 by impurity diffusion from n+ polysilicon emitter electrode 13.

Silicon oxide 15 may cover these regions. Aluminum alloy emitter electrode 16a, base electrode 16b and collector electrode 16c contact with polysilicon emitter electrode 13, polysilicon base electrode 7 and collector lead-out region 5, respectively.

A method for manufacturing the semiconductor device according to the third embodiment will be described with reference to the vertical cross sectional views in main process steps.

FIG. 17A shows the stage just after forming silicon oxide 6 on silicon material 100 by the same process steps as in the first embodiment. Silicon oxide 6 has a thickness of about 100 nm within a preferable range of 50–200 nm.

FIG. 17B is a vertical cross sectional view just after forming polysilicon base electrode 7 and silicon nitride 24. Non-doped polysilicon 7 may be deposited by the known LPCVD. A thickness thereof is preferably 200–400 nm, for example, about 300 nm in this case. Boron may be added to polysilicon 7 by ion implantation. Implantation conditions are, for example, acceleration energy of 10 keV and dose of $1 \times 10^{16}$ cm$^{-2}$. Then, removing undesired polysilicon 7 by photolithography and anisotropic dry etching. Thereafter, it is covered the whole surface with 150 nm thick silicon nitride 24.

Figure 18A:
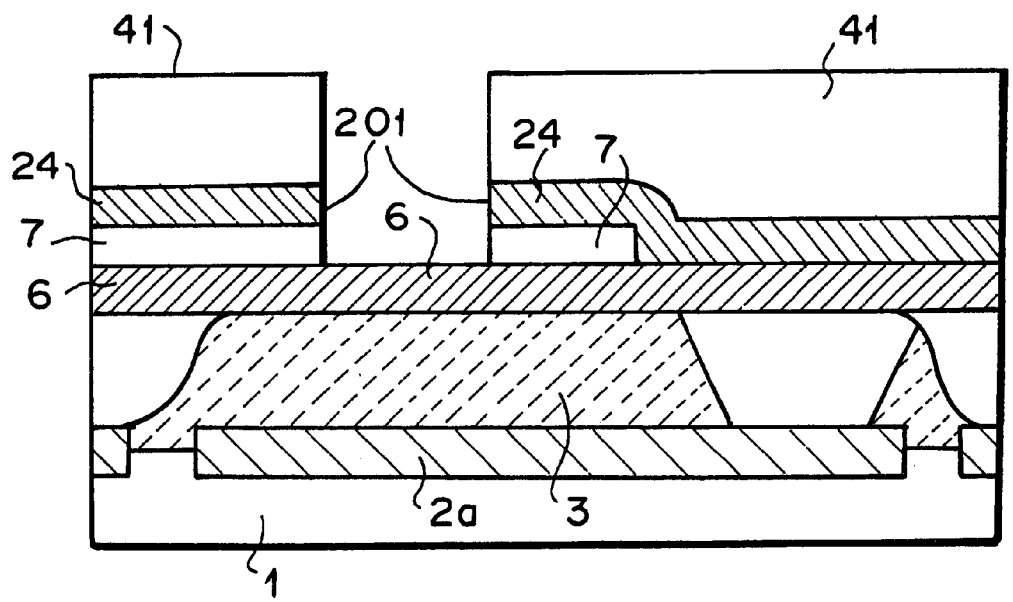

FIG. 18A shows the stage where aperture 201 is opened in silicon nitride 24 and polysilicon base electrode 7 by patterning of photoresist 41 and anisotropic etching.

Figure 18B:
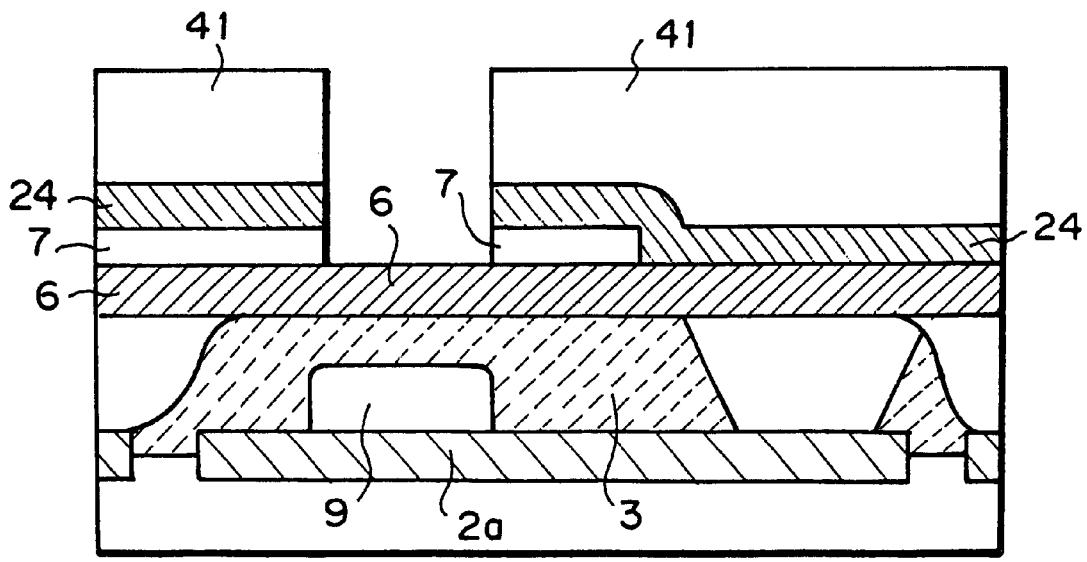

FIG. 18B is a cross sectional view showing the stage where first collector region 9 is formed by implanting of phosphorous ions. Implantation conditions are preferably exemplified with acceleration energy of 300–500 KeV and dose of from $1 \times 10^{12}$ cm$^{-2}$ to $5 \times 10^{13}$ cm$^{-2}$. In this case, the implantation was performed with acceleration energy of 300 KeV and dose of $5 \times 10^{13}$ cm$^{-2}$.

Figure 19A:
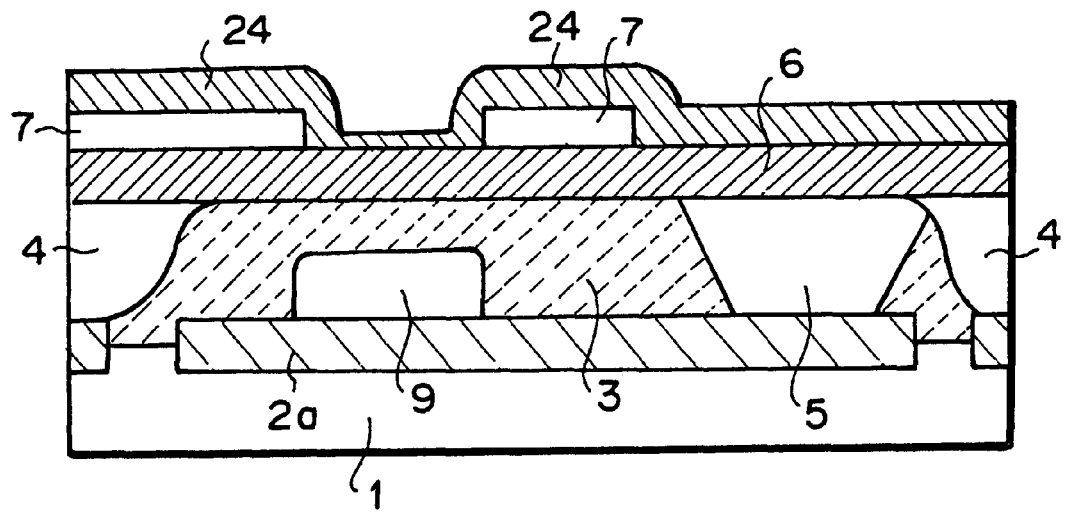

FIG. 19A is a cross sectional view showing the stage where photoresist 41 is removed and silicon nitride 24 is deposited. After depositing silicon nitride 24, heating at 1000° C. for 2 hours in the nitrogen ambient for recovering the damages during the implantation and performing the activation of the implanted phosphorous.

Figure 19B:
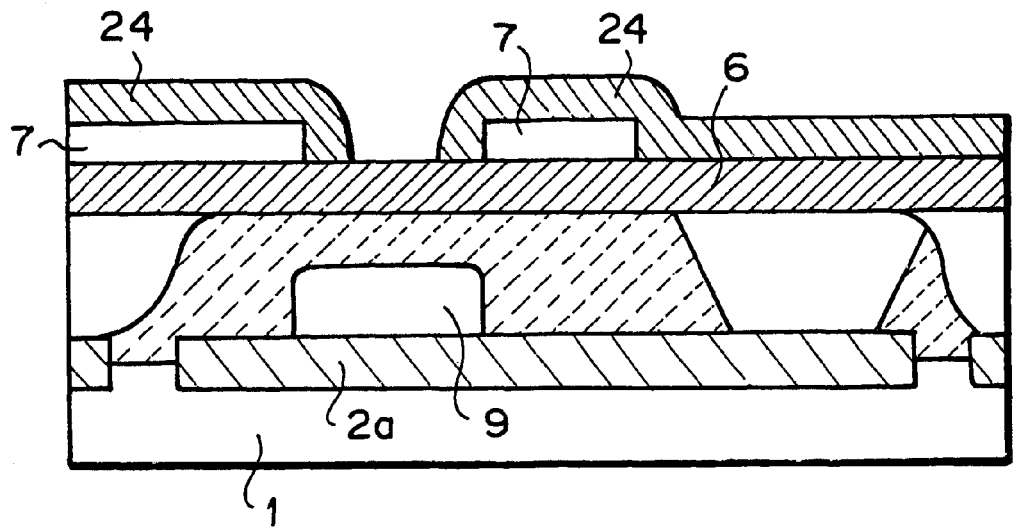

FIG. 19B is a cross sectional view showing the stage where silicon nitride 24 is etched back by a thickness just before deposited by anisotropic dry etching to expose silicon oxide 6.

FIG. 20A is a cross sectional view showing the stage where silicon oxide 6 is etched laterally with an HF-based solution to expose epitaxial silicon collector layer 3 and a lower surface of polysilicon base electrode 7. The size of laterally etched silicon oxide 6 for exposing polysilicon base electrode 7 is controlled at least larger than a thickness of intrinsic base 11 to be formed later.

The side etch size may also be shorter than the thickness of the polysilicon base electrode. In this case, the lower surface of polysilicon base electrode 7 was exposed by about 150 nm.

FIG. 20B is a cross sectional view showing the stage where intrinsic base 31 and polycrystalline layer 32 for making intrinsic base 31 contact with polysilicon base electrode 7 are formed by 10 selective crystal growth. Whereas LPCVD and gas source MBE may be employed as growth conditions, UHV/CVD is exemplified herein under a condition of a substrate temperature of 605° C., $Si_2H_6$ with a flow rate of 3 sccm and $GeH_4$ with a flow rate of 2 sccm. At this time, p type polycrystalline SiGe film 32 may be formed toward silicon collector layer 3 that includes the collector region from the lower surface of the extension of polysilicon base electrode 7. Base region 31 consisting of p type single crystalline SiGe alloy/single crystalline Si may be formed on the exposed portion of silicon collector layer 3. Polycrystalline SiGe alloy/polycrystalline Si multi-layered film 32 may contact with SiGe alloy/Si base region 31 as detailed below.

Growing non-doped SiGe layer 31 on silicon collector 3 within aperture 302. The Ge concentration was about 10%

If a facet may appear at this stage, it does not cause any problem practically. A growth thickness is about 25 nm. The thickness may also be controlled thicker by a heat treatment in the following process within a range that does not cause any defect.

The non-doped polycrystalline SiGe film may also be formed on the lower surface of the p+ polysilicon simultaneously. Heating the polycrystalline film to add boron at a high concentration may realize a p+ polycrystalline SiGe film.

Forming an intrinsic base on non-doped SiGe layer 31. The intrinsic base layer consists of two layers: p+ SiGe layer having a gradient Ge profile; and p type Si layer. The Ge profile, boron concentration profile and thickness thereof will be exemplified next. The layer, which has a concentration profile of Ge in SiGe that decreases from 10% to 0% linearly, has a thickness of 40 nm. On this layer, the 30 nm thick layer not containing Ge or consisting only of Si is present. Boron is added to both the layers at $5 \times 10^{18}$ cm$^{-3}$.

Figure 21A:
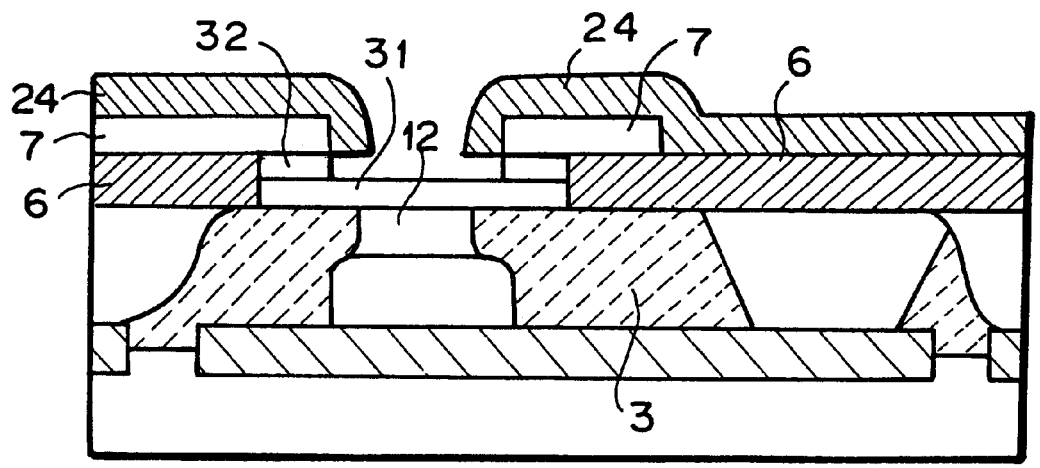
Figure 21B:
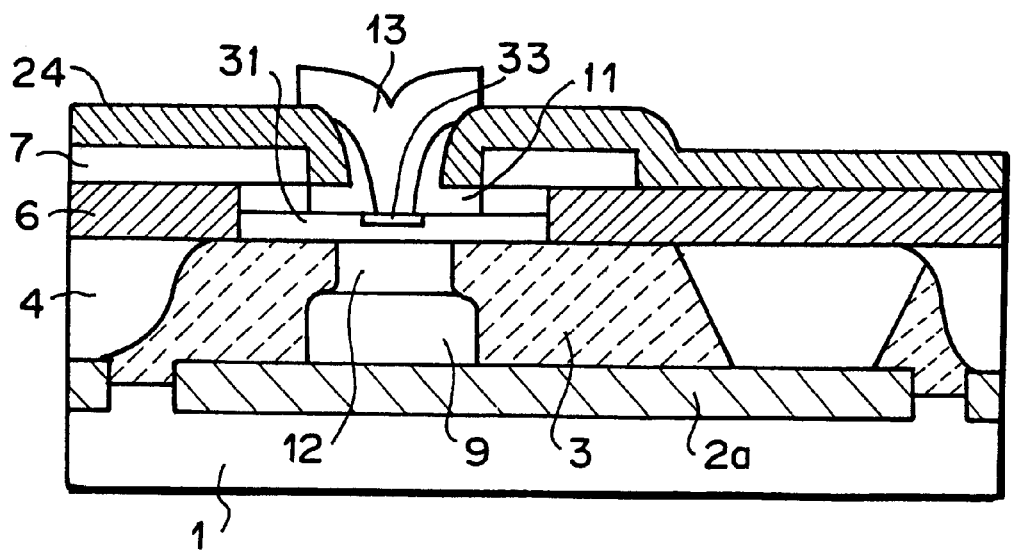

FIG. 21A is a vertical cross sectional view showing the stage where second collector region 12 is formed by implanting phosphorous ions. The implantation condition of phosphorous is required to achieve a smooth connection with the phosphorous profile in first collector region 9. An example of the condition includes an acceleration energy of 200 KeV and a dose of $4 \times 10^{12}$ cm$^{-2}$ Next, depositing a phosphorous-doped polysilicon with a thickness of about 250 nm by LPCVD as same as in the first embodiment. Then, patterning the polysilicon by photolithography and anisotropic dry etch. Thus, n+ polysilicon emitter electrode 13 may be formed. Further, heating (at 930° C. for 10 seconds, for example) for diffusing phosphorous from polysilicon emitter electrode 13 into intrinsic base region 31 to form n+ single crystalline emitter region 33.

Thereafter, it is covered the whole wafer with about 300 nm thick silicon oxide 15. Then, opening an aperture to reach at polysilicon emitter electrode 13, polysilicon base electrode 7 and collector lead-out region 5 by photolithography and anisotropic dry etch. Removing the photoresist, spattering the aluminum alloy and patterning by photoresist and dry etch may complete the device shown in FIG. 16.

Figure 22:
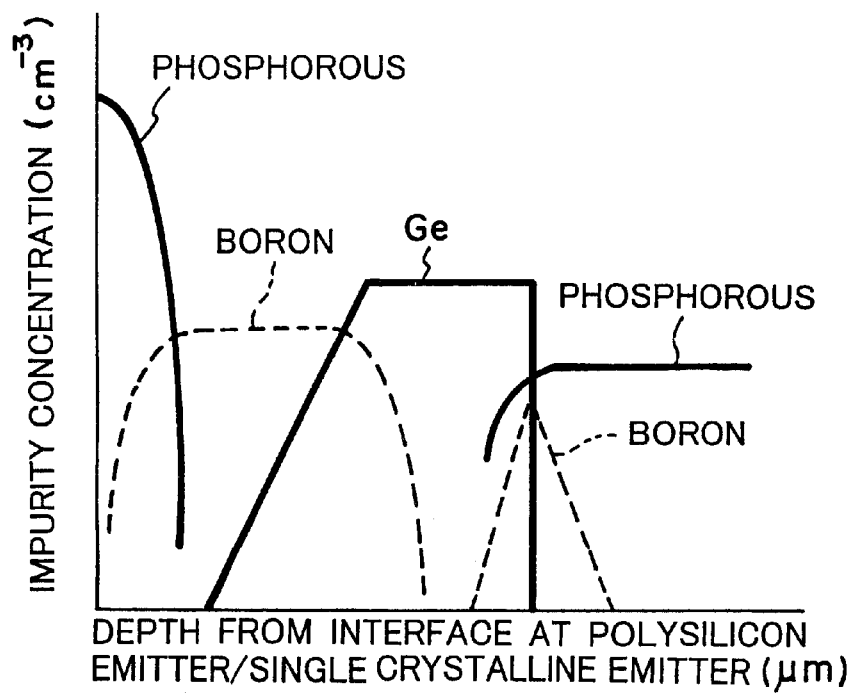
FIG. 22 shows an impurity profile in the semiconductor device according to the present invention.

A specific problem regarding the SiGe base may be solved as described below. FIG. 22 is a characteristic diagram showing an impurity profile in the SiGe base transistor according to the present invention, in which the transversal axis indicates depths (μm) from the emitter interface of the poly/single crystalline emitter and the longitudinal axis impurity concentrations (cm$^{-3}$) thereof. There is the emitter region with a depth of 30 nm from the surface, into which phosphorous is diffused from the polysilicon emitter. In the next 40 nm region, the region contains boron at about $5 \times 10^{18}$ cm$^{-3}$ and Ge concentration increases monotonously from 0% to 10%.

The following 25 nm region consists of the SiGe alloy with a constant Ge concentration (for example, Ge=10%). Phosphorous ions are implanted at a concentration higher than that of boron in the region into a portion near the surface of this region and also into another portion apart from the surface of the SiGe alloy layer (a portion that is 95 nm apart from the most surface).

Figure 23:
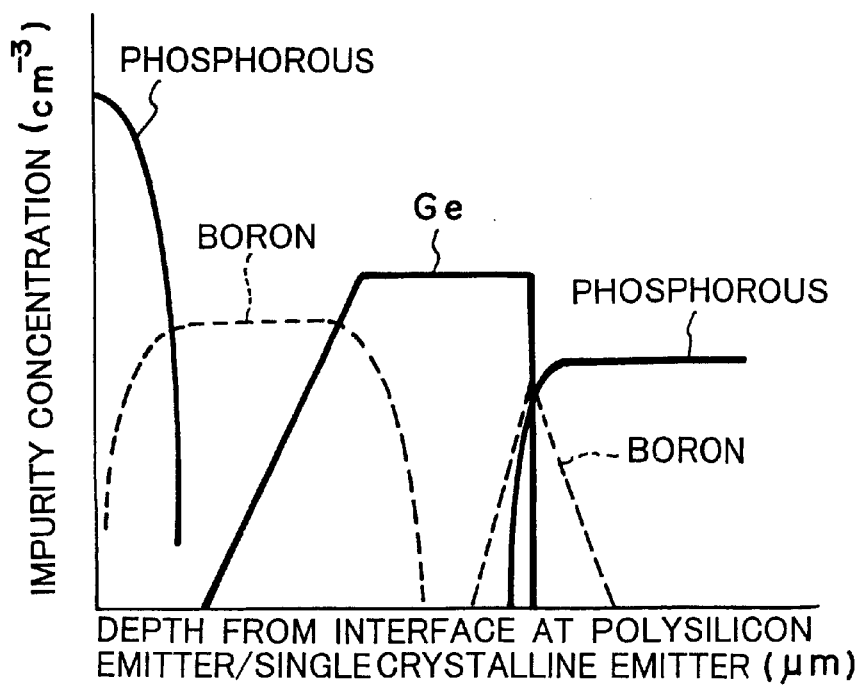
FIG. 23 shows an impurity profile in the semiconductor device according to the related art.
Figure 24:
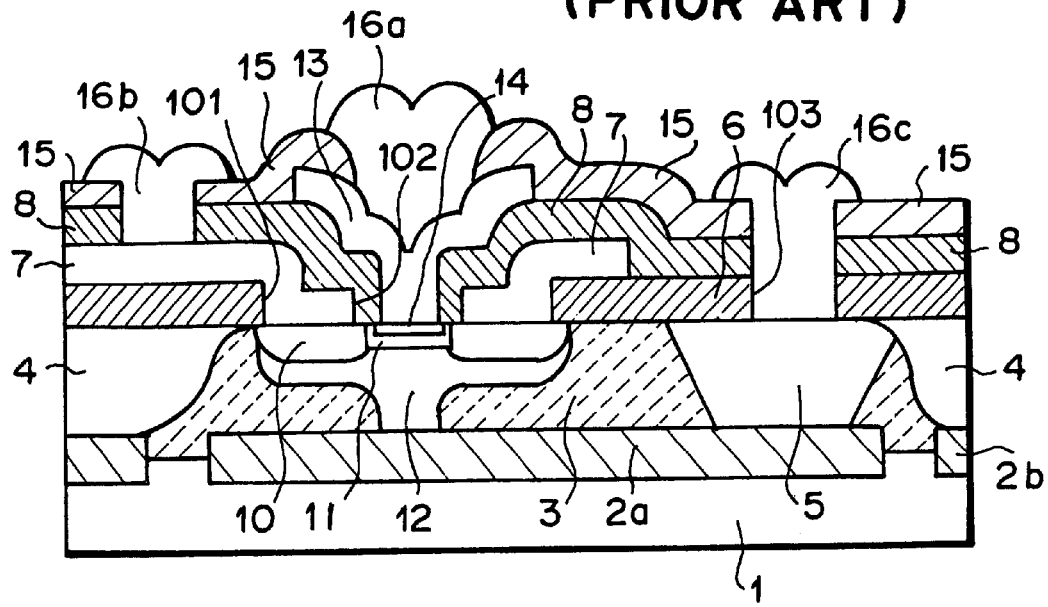
FIGS. 24, 25, 26 and 27 are vertical cross sectional views showing different semiconductor devices according to the related art.
Figure 25:
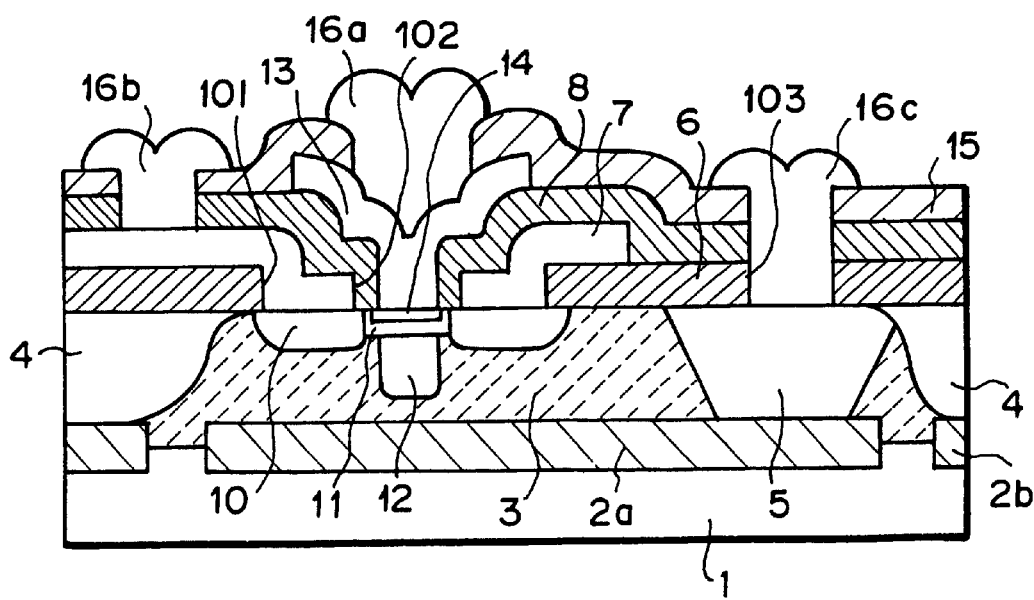
Figure 26:
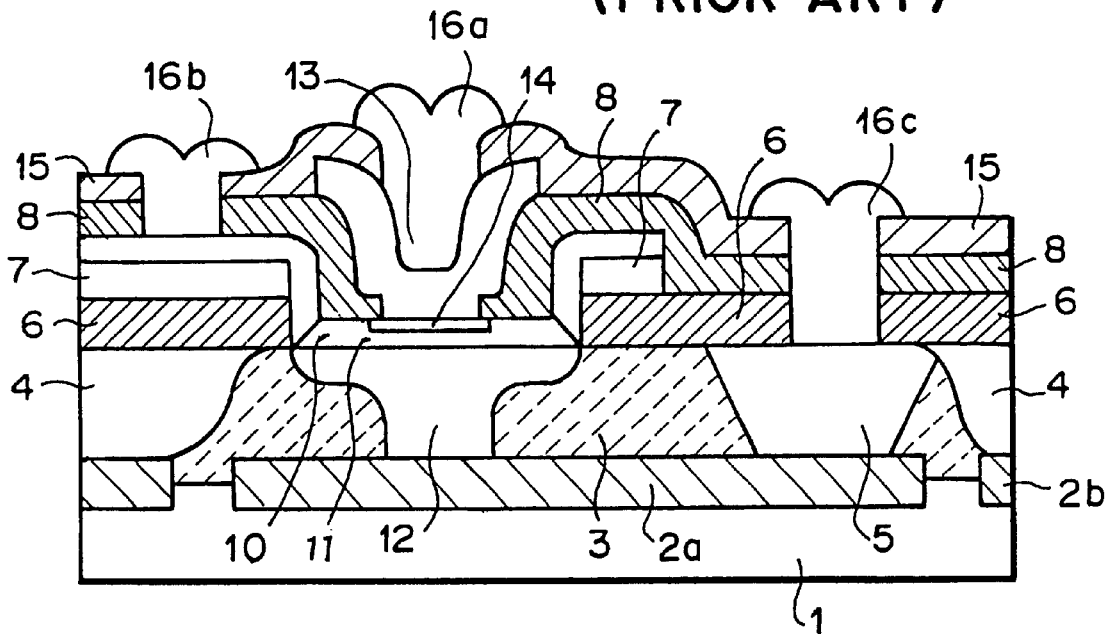
Figure 27:
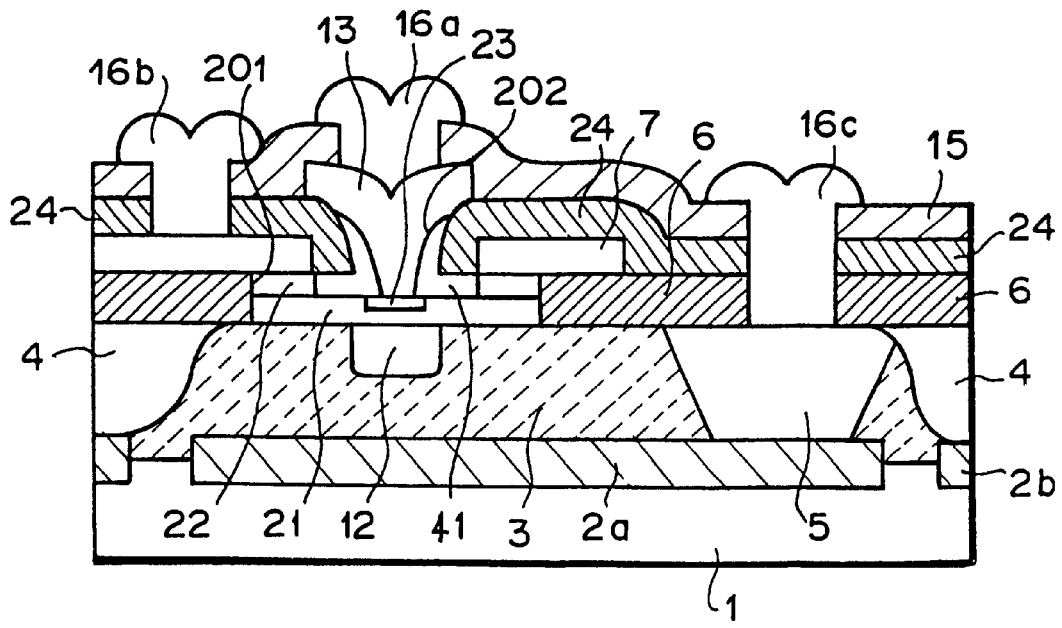

FIG. 23 shows an impurity profile in the art obtained from the SiGe base transistor formed by growing SiGe after implanting phosphorous ions previously. A difference from FIG. 22 lies in that the boron concentration is higher than the phosphorous concentration at a portion close to the hetero-interface of SiGe/Si.

According to the present embodiment, the boron-doped region formed at the SiGe/Si interface can be completely compensated into n type with phosphorous.

The present embodiment may miniaturize the device relative to the second embodiment because the base region (including the outer base) and the emitter region may be determined by photolithography once.

The conventional method performs the implantation of phosphorous ions, the diffusion of phosphorous from the collector region and the cancellation of boron at the epiatxial SiGe/Si interface. A sufficiently high phosphorous concentration is required in the phosphorous diffusion to cancel boron. To the contrary, the present embodiment implants phosphorous ions with controlling the implantation energy in accordance with the interface depth and thus can reduce the phosphorous concentration as low as possible. Reduction of the collector concentration may decrease the base-collector junction capacitance and may further increase cut-off frequency $f_T$.

The semiconductor device according to the present invention has the following advantages compared to the semiconductor device in the art. First, improvement of cut-off frequency $f_T$ and reduction of collector-base capacitance $C_{CB}$ may be achieved at the same time.

Figure 7:
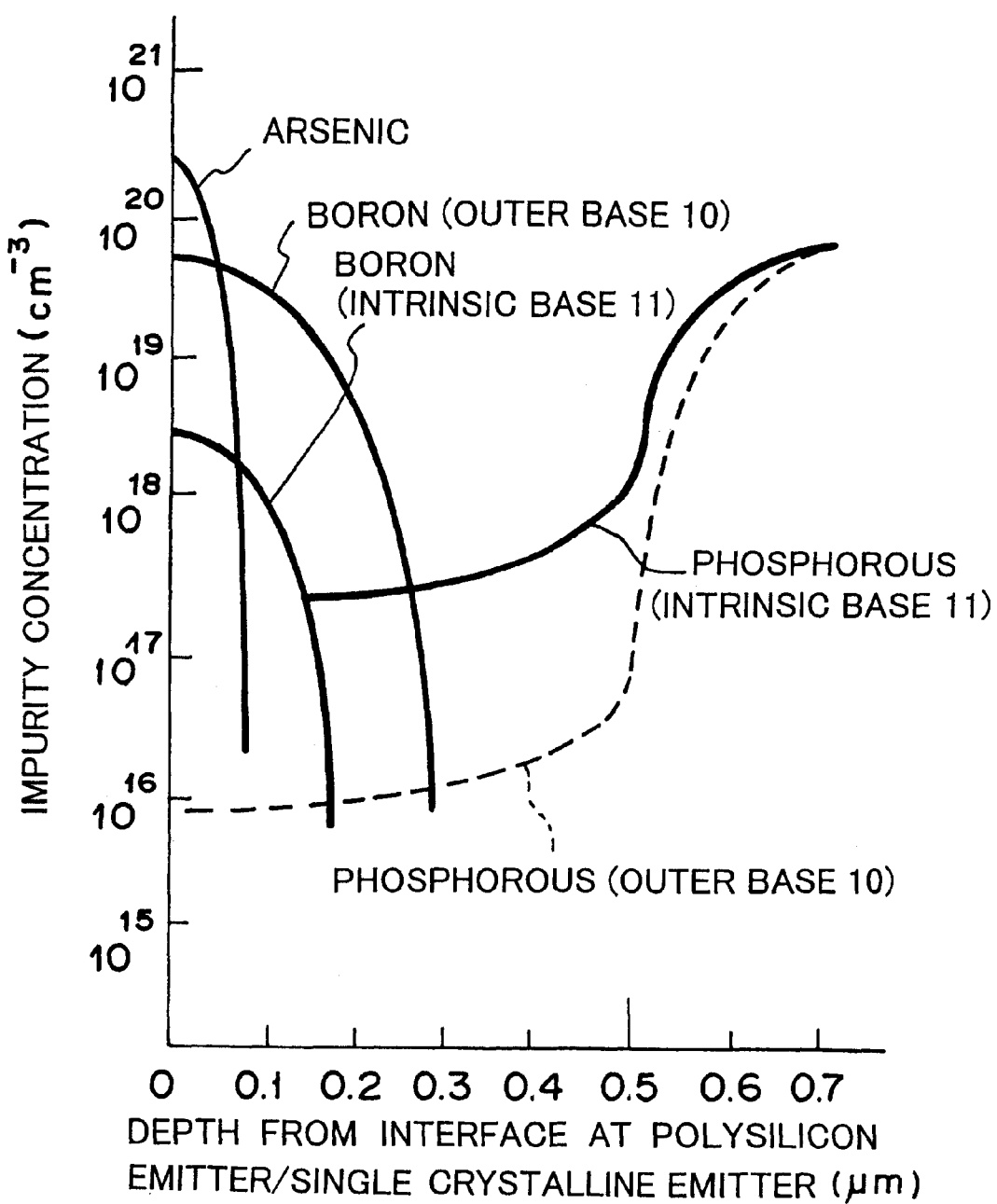
FIG. 7 shows an impurity profile in the semiconductor device according to the present invention.

FIG. 7 is an impurity profile in the transistor according to the present invention, in which the traversal axis indicates depths (μm) from the emitter interface of the poly/single crystalline emitter and the longitudinal axis impurity concentrations (cm$^{-3}$) thereof. In the intrinsic region, the emitter consists of arsenic and has a depth of about 0.08 μm, the base region consists of boron with a concentration of $10^{18}$ cm$^{-3}$ and has a depth of 0.08–0.15 μm, and the collector consists of phosphorous with a concentration of about $2 \times 10^{17}$ cm$^{-3}$. In the outer region profile, the boron concentration that is $10^{19}$ cm$^{-3}$ at the surface decreases to make a junction with phosphorous having a concentration of about $1 \times 10^{16}$ cm$^{-3}$ at a depth of about 0.28 μm to where the outer base Extends.

Figure 8:
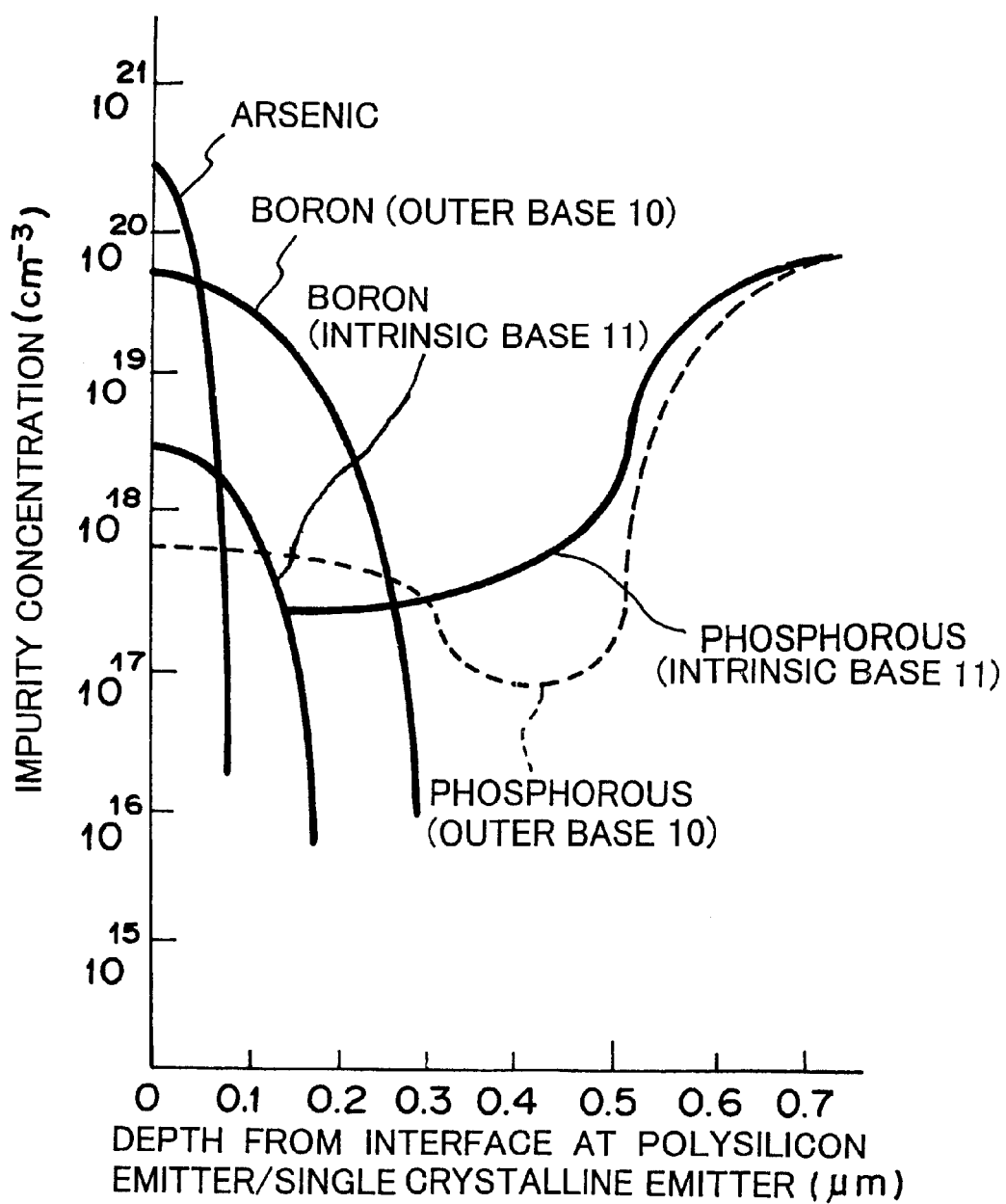
FIG. 8 shows an impurity profile in the semiconductor device according to the related art.

FIG. 8 shows an impurity profile regarding the transistor in the art. The intrinsic region is similar to that in FIG. 7. In the outer region, the boron-doped outer base lies in a range from the surface to about 0.26 μm depth, and phosphorous with a concentration of $10^{17}$ cm$^{-3}$ is present beneath the outer base. In the conventional transistor, the impurity concentration of the collector region directly beneath intrinsic base 11 is almost equal to that of the collector region adjacent to outer base 10. The impurity concentration of the intrinsic base 11 clearly differs from the impurity concentration of the region adjacent to outer base 11. Therefore, the transistor according to the present invention, the impurity concentration of the collector region directly beneath the intrinsic base is almost equal to that in the art, and the impurity concentration of the collector region adjacent to the outer base is equal to the original impurity concentration of epitaxial silicon collector layer 3.

The above difference in the impurity concentrations may effectively reduce the capacitance. If applying 1V across C-B, a capacitance per unit area of the outer base may not differ from that of the intrinsic base, and the both exhibit about $1.2 \times 10^5$ pF/cm$^2$ (Nc: $2 \times 10^{17}$ cm$^{-3}$).

To the contrary, according to the present invention, intrinsic base capacitance per unit area is equal to that in the art. However, the outer base capacitance per unit area, about $7 \times 10^4$ pF/cm$^2$ (Nc: $5 \times 10^{16}$ cm$^{-3}$), is a half that in the art. Thus, the reduction of $C_{CB}$ and the increase of cut-off frequency $f_T$ can be achieved.

Second, the electric property variation due to the film thickness variation of the epitaxial silicon collector layer can be reduced by the process that may increase the concentration of the n$^-$ epitaxial silicon layer close to the n$^+$ buried layer.

This effect may be obtained from the reason that ions can be implanted into a deep region only beneath the intrinsic base and thus the effective thickness variation of the epitaxial layer can be absorbed by the phosphorous ion implantation.

Having described preferred embodiments of the invention it will now become apparent to those of ordinary skill in the art that other embodiments incorporated these concepts may be used. Accordingly, it is submitted that the invention should not be limited to the described embodiments but rather should be limited only by the spirit and scope of the appended claims.

What is claimed is:

1. A method for fabricating a semiconductor device comprising, in the listed sequence, the steps of:
    forming a silicon material having a high concentration buried layer and a low concentration surface region;
    forming a first insulating film on said silicon material;
    depositing a polysilicon base electrode;
    removing said undesired polysilicon by photolithography and anisotropic dry etching;
    covering the whole surface with a second insulating film having a different substance from that of said first insulating film;
    opening an aperture in said second insulating film and said polysilicon base electrode;
    implanting phosphorous ions to form a first collector region;
    forming a third insulating film having the same substance as that of said second insulating film;
    etching back said third insulating film by a thickness deposited just before to expose said first insulating film in a region over the first collector region;
    etching said first insulating film in the lateral direction to expose said silicon material and a lower surface of said polysilicon base electrode;
    forming an intrinsic base and a polycrystalline outer base for connecting said intrinsic base with said polysilicon base electrode by selective crystal growth; and
    implanting phosphorous ions to form a second collector region.

2. A method for fabricating a semiconductor device according to claim 1,
    wherein said base region comprises a single crystalline SiGe alloy film or a multi-layered film consisting of a single crystalline SiGe alloy and a single crystalline Si.

3. A method for fabricating a semiconductor device according to claim 1 further comprising the steps of:
    forming a side wall consisting of a fourth insulating film in said aperture;
    forming polysilicon emitter electrode; and
    forming a single emitter region with an impurity diffused into said intrinsic base region.

4. The method for fabricating a semiconductor device according to claim 1, wherein:
    boron is introduced into the second collector region;
    a phosphor impurity density in said first collector region is continuously connected with that in said second collector region; and
    said phosphor impurity density in said second collector region is greater than a boron impurity throughout said second collector region.

5. The method for fabrication a semiconductor device according to claim 1, wherein an implantation energy of said phosphorous ions to form said second collector region is adjusted such that an implantation depth of said phosphorous ions is placed at the boundary between said intrinsic base and said second collector region.

6. The method of claim 1, wherein the first insulating film is formed with a uniform thickness.

7. The method of claim 1, wherein in said step of implanting phosphorous ions to form a first collector region, the phosphorous ions are implanted through the first insulating film covering a bottom of the aperture in the second insulating film and the polysilicon base electrode.

8. The method of claim 1, wherein said silicon material has a silicon oxide for device isolation.

9. A method for fabricating a semiconductor device comprising the steps of:
    forming a silicon material having a high concentration buried layer and a low concentration surface region;
    forming a first insulating film on said silicon material;
    depositing a polysilicon base electrode;
    removing said undesired polysilicon by photolithography and anisotropic dry etching;
    covering the whole surface with a first nitride insulating film;
    opening an aperture in said first nitride insulating film and said polysilicon base electrode, leaving said first insulating film covering a bottom surface of said aperture;
    forming a first collector region by implanting phosphorous ions via said aperture and through said first insulating film covering said bottom surface;
    forming a second nitride insulating film over an interior surface of said aperture;
    etching back said second nitride insulating film to expose said first insulating film covering the aperture bottom;
    etching said first insulating film in the lateral direction to expose said silicon material and a lower surface of said polysilicon base electrode;
    after etching to expose a lower surface of the base electrode, forming an intrinsic base and a polycrystalline outer base for connecting said intrinsic base with said polysilicon base electrode by selective crystal growth; and
    implanting phosphorous ions to form a second collector region extending from said first collector region and contacting said intrinsic base.

10. The method of claim 9, wherein said silicon material has a silicon oxide for device isolation.

11. The method of claim 9, wherein said intrinsic base comprises a SiGe film or a multi-layered film of a SiGe layer and a Si layer.

12. The method of claim 9, further comprising the steps of:
    forming a side wall of a second insulating film in said aperture;
    then forming a polysilicon emitter electrode containing an impurity; and
    then diffusing the impurity in the polysilicon emitter electrode into said intrinsic base region to form an emitter region.

13. The method of claim 9, wherein,
    boron is introduced into the second collector region;
    a phosphor impurity density in said first collector region is continuously connected with a phosphor impurity in said second collector region; and
    said phosphor impurity density in said second collector region is greater than a boron impurity density throughout said second collector region.

14. The method of claim 9, wherein an implantation energy of said phosphorous ions to form said second collector region is adjusted such that an implantation depth of said phosphorous ions is placed at a boundary between said intrinsic base and said first and second collector region.

* * * * *